(12) United States Patent  (10) Patent No.: US 9,299,741 B2
Tomita  (45) Date of Patent: Mar. 29, 2016

(54) SOLID-STATE IMAGING DEVICE AND LINE SENSOR

(71) Applicant: Kabushiki Kaisha Toshiba, Minato-ku (JP)

(72) Inventor: Ken Tomita, Iwate (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 243 days.

(21) Appl. No.: 14/188,861

(22) Filed: Feb. 25, 2014

(65) Prior Publication Data

US 2015/0028394 A1  Jan. 29, 2015

(30) Foreign Application Priority Data

Jul. 25, 2013  (JP) .................................. 2013-154541

(51) Int. Cl.
H01L 27/148 (2006.01)
H01L 27/146 (2006.01)

(52) U.S. Cl.
CPC .... *H01L 27/14812* (2013.01); *H01L 27/14614* (2013.01); *H01L 27/14623* (2013.01); *H01L 27/14818* (2013.01); *H01L 27/148* (2013.01); *H01L 27/14643* (2013.01)

(58) Field of Classification Search
USPC ...................... 257/222, 225, 291, 292; 438/75
See application file for complete search history.

(56) References Cited

U.S. PATENT DOCUMENTS

| | | | |
|---|---|---|---|
| 6,515,268 B1 | 2/2003 | Kitayama et al. | |
| RE40,409 E | 7/2008 | Kitayama et al. | |
| 7,414,276 B2 | 8/2008 | Monoi | |
| 8,183,657 B2 | 5/2012 | Kuwazawa | |
| 2009/0039395 A1* | 2/2009 | Tachikawa ........ | H01L 27/14812 257/225 |
| 2012/0193745 A1 | 8/2012 | Onuki et al. | |

FOREIGN PATENT DOCUMENTS

| | | |
|---|---|---|
| JP | 2000-174252 | 6/2000 |
| JP | 2005-50951 | 2/2005 |
| JP | 2006-120966 | 5/2006 |
| JP | 2011-82425 | 4/2011 |

* cited by examiner

*Primary Examiner* — Errol Fernandes
(74) *Attorney, Agent, or Firm* — Oblon, McClelland, Maier & Neustadt, L.L.P.

(57) ABSTRACT

Certain embodiments provide a solid-state imaging device including a pixel portion including a first light receiving layer, a charge accumulation portion including a first charge accumulation layer which accumulates a charge, a first transfer gate portion, a charge detection portion and a second transfer gate portion. The first transfer gate portion transfers the charge from the pixel portion to the charge accumulation portion, and the second transfer gate portion transfers the charge from the charge accumulation portion to the charge detection portion. The charge detection portion causes a voltage drop corresponding to an amount of the charge transferred to this region. An impurity layer of a ring shape which includes an opening portion is provided on a surface of at least one of the first light reception layer of the pixel portion and the first charge accumulation layer of the charge accumulation portion.

20 Claims, 11 Drawing Sheets

SOLID-STATE IMAGING DEVICE AND LINE SENSOR

CROSS REFERENCE TO RELATED APPLICATIONS

This application is based upon and claims the benefit of priority from the prior Japanese Patent Application No. 2013-154541 filed in Japan on Jul. 25, 2013; the entire contents of which are incorporated herein by reference.

FIELD

Embodiments described herein relate generally to a solid-state imaging device and a line sensor.

BACKGROUND

A solid-state imaging device in which a charge accumulation portion is provided between each pixel portion and an offset gate portion to switch resolution is known as a related art solid-state imaging device.

In this solid-state imaging device, a charge accumulation portion is a region which temporarily accumulates a charge produced in each pixel portion, and has an N-type charge accumulation layer provided on a surface of a P-type well layer on a surface of a semiconductor substrate. The charge accumulation layer is provided by injecting impurities in a wide range of the surface of the well layer.

However, when a charge accumulation layer has a wide area as described above, a deepest portion of an electric potential of a charge accumulation portion is provided near the center of the charge accumulation portion. Although a charge accumulated in the charge accumulation portion is transferred to an offset gate portion by applying a voltage to a transfer gate portion between the charge accumulation portion and the offset gate portion, when a deepest portion of an electric potential is formed near the center of the charge accumulation portion, the charge is likely to be accumulated near the center of the charge accumulation portion. Thus, the charge is accumulated at a site distant from the transfer gate portion, and therefore the voltage to be applied to the transfer gate portion to transfer the charge increases. As a result, there is a problem that a voltage margin of the voltage to be applied to the transfer gate portion is small, and it is difficult to read the charge at a low voltage.

BRIEF DESCRIPTION OF THE DRAWINGS

FIG. 6A is a cross-sectional view of the solid-state imaging device illustrated in FIG. 2, and FIG. 6B is a view illustrating an electric potential in the cross section illustrated in FIG. 6A;

FIG. 7A is a plan view of the second charge accumulation portion illustrated in FIG. 3, FIG. 7B illustrates an electric potential in the cross section along a dashed-dotted line C-C' in FIG. 7A, FIG. 7C illustrates an electric potential in a cross section along a dashed-dotted line D-D' in FIG. 7A and FIG. 7D illustrates an electric potential in a cross section along a dashed-dotted line E-E' in FIG. 7A;

FIG. 8A is a plan view of the second charge accumulation portion of the related art solid-state imaging device, FIG. 8B illustrates an electric potential in the cross section along the dashed-dotted line c-c' in FIG. 8A, FIG. 8C illustrates an electric potential in across section along the dashed-dotted line d-d' in FIG. 8A, and FIG. 8D illustrates an electric potential in the cross section along the dashed-dotted line e-e' in FIG. 8D;

FIG. 9A is a plan view of the first charge accumulation portion, FIG. 9B illustrates an electric potential in a cross section along a dashed-dotted line F-F' in FIG. 9A and FIG. 9C illustrates an electric potential in a cross section along a dashed-dotted line G-G' in FIG. 9A;

DETAILED DESCRIPTION

Figure 1:
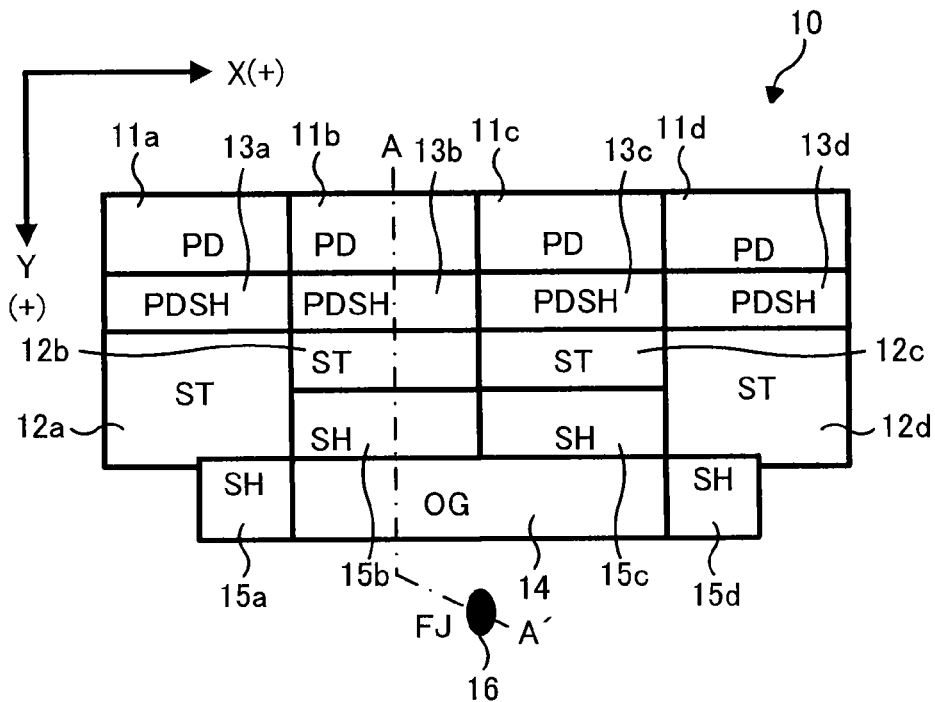
FIG. 1 is a plan view schematically illustrating main components of a solid-state imaging device according to a first embodiment.

Certain embodiments provide a solid-state imaging device including a pixel portion, a charge accumulation portion, a first transfer gate portion, a charge detection portion and a second transfer gate portion. The pixel portion includes a first light reception layer which is provided in a planar shape on the surface of the semiconductor substrate, and which produces a charge according to a received light amount of incident light. The charge accumulation portion includes a first charge accumulation layer which is provided in a planar shape on a surface of the semiconductor substrate and which accumulates the charge produced in the pixel portion. The first transfer gate portion reads the charge from the pixel portion, and transfers the charge to the charge accumulation portion. The charge detection portion to which the charge accumulated in the charge accumulation portion is transferred causes a voltage drop corresponding to an amount of the transferred charge. The second transfer gate portion reads the charge accumulated in the charge accumulation portion, and transfers the charge to the charge detection portion. An impurity layer of a ring shape which includes an opening portion is provided on a surface of at least one of the first light reception layer of the pixel portion and the first charge accumulation layer of the charge accumulation portion.

Certain embodiments provide a solid-state imaging device including a plurality of pixel portions, a plurality of charge accumulation portions, a plurality of first transfer gate portions, a charge detection portion, a plurality of second transfer gate portions and an offset gate portion. Each of the plurality of pixel portions includes a first light receiving layer which is provided on a surface of a semiconductor substrate and which produces a charge according to the amount of received light of incident light. The plurality of pixel portions are arranged in a line form. Each of the plurality of charge accumulation portions includes a first charge accumulation layer which is provided on the surface of the semiconductor substrate and which accumulates the charge produced in the pixel portion. The plurality of charge accumulation portions are aligned in a line form in parallel to an alignment direction of the plurality of pixel portions. The plurality of first transfer gate portions reads the charge from the plurality of pixel portions and transfers the charge to the plurality of charge accumulation portions. The charge detection portion to which the charge accumulated in the plurality of charge accumulation portions is transferred causes a voltage drop corresponding to an amount of the transferred charge. The plurality of second transfer gate portions reads the charge accumulated in the plurality of charge accumulation portions and transfers the charge to the charge detection portion. The offset gate portion has a shape which has long sides extending in a longitudinal direction which is the arrangement direction of the plurality of pixel portions and short sides extending in a direction substantially perpendicular to the longitudinal direction. The offset gate portion is provided between the plurality of second transfer gate portions and the charge detecting portion so that the long sides and the short sides are adjacent to the plurality of second transfer gate portions. A predetermined constant voltage is applied to the offset gate portion. An impurity layer of a ring shape which includes an opening portion is provided on a surface of at least one of the plurality of first light receiving layers of the plurality of pixel portions and the plurality of first charge accumulation layers of the plurality of charge accumulation portions.

Certain embodiments provide a solid-state imaging device including a pixel portion, a charge detection portion and a transfer gate portion. The pixel portion includes a first light receiving layer and a second light receiving layer. The first light receiving layer is provided on a surface of a semiconductor substrate and produces a charge according to an amount of received light of incident light. The second light receiving layer is an impurity layer of a ring shape which has an opening portion. The second light receiving layer is provided on a surface of the first light receiving layer so as to be in contact with the transfer gate portion. The charge detection portion to which the charge accumulated in the pixel portion is transferred causes a voltage drop corresponding to the amount of the transferred charge. The transfer gate portion reads the charge accumulated in the pixel portion, and transfers the charge to the charge detection portion.

Certain embodiments provide a line sensor including a circuit substrate, a plurality of solid-state imaging devices, a light guide body and a lens array. The plurality of solid-state imaging devices is linearly arranged on a surface of the circuit substrate. The light guide body is arranged above the surface of the circuit substrate, and emits light to a subject. The lens array is arranged above the surface of the circuit substrate, and condenses the light reflected from the substrate on the plurality of solid-state imaging devices. In this line sensor, each of the plurality of solid-state imaging devices includes a pixel portion, a charge accumulation portion, a first transfer gate portion, a charge detection portion and a second transfer gate portion. The pixel portion includes a first light reception layer which is provided in a planar shape on the surface of the semiconductor substrate, and which produces a charge according to a received light amount of incident light. The charge accumulation portion includes a first charge accumulation layer which is provided in a planar shape on a surface of the semiconductor substrate and which accumulates the charge produced in the pixel portion. The first transfer gate portion reads the charge from the pixel portion, and transfers the charge to the charge accumulation portion. The charge detection portion to which the charge accumulated in the charge accumulation portion is transferred causes a voltage drop corresponding to an amount of the transferred charge. The second transfer gate portion reads the charge accumulated in the charge accumulation portion, and transfers the charge to the charge detection portion. An impurity layer of a ring shape which includes an opening portion is provided on a surface of at least one of the first light reception layer of the pixel portion and the first charge accumulation layer of the charge accumulation portion.

Hereinafter, a solid-state imaging device and a line sensor according to embodiments will be described.

First Embodiment

FIG. 1 is a plan view schematically illustrating main components of a solid-state imaging device 10 according to the first embodiment. In addition, the solid-state imaging device 10 according to the present embodiment is formed by aligning in a row a plurality of cells whose one cell includes four pixels, the present embodiment is not limited to a solid-state imaging device which includes four pixels in one cell, and the number of pixels included in one cell may be four or more pixels and may be, for example, eight pixels.

In the solid-state imaging device 10 illustrated in FIG. 1, four pixel portions (PD) 11$a$, 11$b$, 11$c$ and 11$d$ are aligned in a row. In the above description, the four pixel portions 11$a$, 11$b$, 11$c$ and 11$d$ are referred to as a first pixel portion 11$a$, a second pixel portion 11$b$, a third pixel portion 11$c$ and a fourth pixel portion 11$d$ from the left side of FIG. 1 in order. Further, a direction which is parallel to the row of the pixel portions 11$a$, 11$b$, 11$c$ and 11$d$ is referred to as an X direction, a direction which is vertical to the X direction is referred to as a Y direction, and a direction which goes from the first pixel portion 11$a$ to the second pixel portion 11$d$ is referred to as an X (+) direction. Further, the direction which is vertical to the X direction is referred to as the Y direction, and a direction which is apart from the pixel portions 11$a$, 11$b$, 11$c$ and 11$d$ is referred to as a Y (+) direction. That is, the four pixel portions 11$a$, 11$b$, 11$c$ and 11$d$ are aligned toward the X (+) direction in this order and along the X direction. In addition, the respective pixel portions 11$a$, 11$b$, 11$c$ and 11$d$ are provided such that a longitudinal direction of the pixel portions 11$a$, 11$b$, 11$c$ and 11$d$ is oriented toward the X direction.

Each of the pixel portions 11a, 11b, 11c and 11d receives light (incident light) irradiated on this region, and produces a charge amount according to the amount of received light.

In addition, each of the actual pixel portions 11a, 11b, 11c and 11d has a polygonal shape which adopts the X direction as the longitudinal direction, and a polygonal shape which is approximated to a rectangular shape which adopts the X direction as the longitudinal direction. Hence, in above FIG. 1 and each figure described below, each of the pixel portions 11a, 11b, 11c and 11d has a rectangular shape. Further, the following description assumes that each of the pixel portions 11a, 11b, 11c and 11d has a rectangular shape.

A first charge accumulation portion (ST) 12a is provided at a position which is spaced apart in the Y (+) direction from the first pixel portion 11a. Similarly, a second charge accumulation portion (ST) 12b is provided at a position which is spaced apart in the Y (+) direction from the second pixel portion 11b, a third charge accumulation portion (ST) 12c is provided at a position which is spaced apart in the Y (+) direction from the third pixel portion 11c, and a fourth charge accumulation portion (ST) 12d is provided at a position which is spaced apart in the Y (+) direction from the fourth pixel portion 11a. These charge accumulation portions 12a, 12b, 12c and 12d are provided toward the X (+) direction in this order and in a row along an alignment direction (X direction) of the pixel portions 11a, 11b, 11c and 11d.

Each of the charge accumulation portions 12a, 12b, 12c and 12d receives a transferred charge produced in the corresponding pixel portions 11a, 11b, 11c and 11d, and temporarily accumulates the transferred charge. By providing these regions, it is possible to switch the resolution.

First transfer gate portions (PDSH) 13a, 13b, 13c and 13d are provided between the pixel portions 11a, 11b, 11c and 11d and the charge accumulation portions 12a, 12b, 12c and 12d which correspond to each other.

Each of the first transfer gate portions 13a, 13b, 13c and 13d reads the charge produced in each of the pixel portions 11a, 11b, 11c and 11d, and transfers the charge to each of the charge accumulation portions 12a, 12b, 12c and 12d which corresponds to each of the pixel portions 11a, 11b, 11c and 11d.

An offset gate portion (OG) 14 which has a shape which adopts the X direction as the longitudinal direction is provided at the position which is spaced apart in the Y (+) direction from the second charge accumulation portion 12b and the third charge accumulation portion 12c.

A predetermined constant voltage V0 (for example, V0=0 V) is applied to the offset gate portion 14. When a constant voltage is applied in this way, the offset gate portion 14 improves accuracy to read a signal voltage in a charge detection portion 16 described below. When the accuracy to read the signal voltage in the charge detection portion 16 is within an allowable range, the offset gate portion 14 may not be provided.

In addition, although the actual offset gate portion 14 has a polygonal shape which adopts the X direction as the longitudinal direction, the offset gate portion 14 may have a polygonal shape which is approximated to a rectangular shape. Hence, in above FIG. 1 and each figure described below, the offset gate portion 14 has a rectangular shape. Further, the following description assumes that the offset gate portion 14 has a rectangular shape.

Second transfer gate portions (SH) 15b and 15c are provided between one long side which forms the shape of the offset gate portion 14, and the second charge accumulation portion 12b and the third charge accumulation portion 12c. Further, a second transfer gate portion (SH) 15a is provided between one short side which forms the shape of the offset gate portion 14 and the first charge accumulation portion 12a, and a second transfer gate portion (SH) 15d is provided between the other short side which opposes to the one short side of the offset gate portion 14 and the fourth charge accumulation portion 12d.

That is, the second charge accumulation portion 12b and the third charge accumulation portion 12c are connected to the long side of the offset gate portion 14 through the second transfer gate portions 15b and 15c, and the first charge accumulation portion 12a and the fourth charge accumulation portion 12d are connected to the short sides of the offset gate portion 14 through the second transfer gate portions 15a and 15d.

Each of the second transfer gate portions 15a, 15b, 15c and 15d reads the charge accumulated in each of the charge accumulation portions 12a, 12b, 12c and 12d, and transfers the charge to the charge detection portion 16 described below through the offset gate portion 14.

The charge detection portion (FJ) 16 which is a floating junction is provided at a position which is adjacent to the other long side which opposes to the one long side of the offset gate portion 14.

The charge detection portion 16 is a region causes a voltage drop according to the charge amount of the charge transferred to this region, and in which the caused voltage drop is read as a signal voltage.

Figure 2:
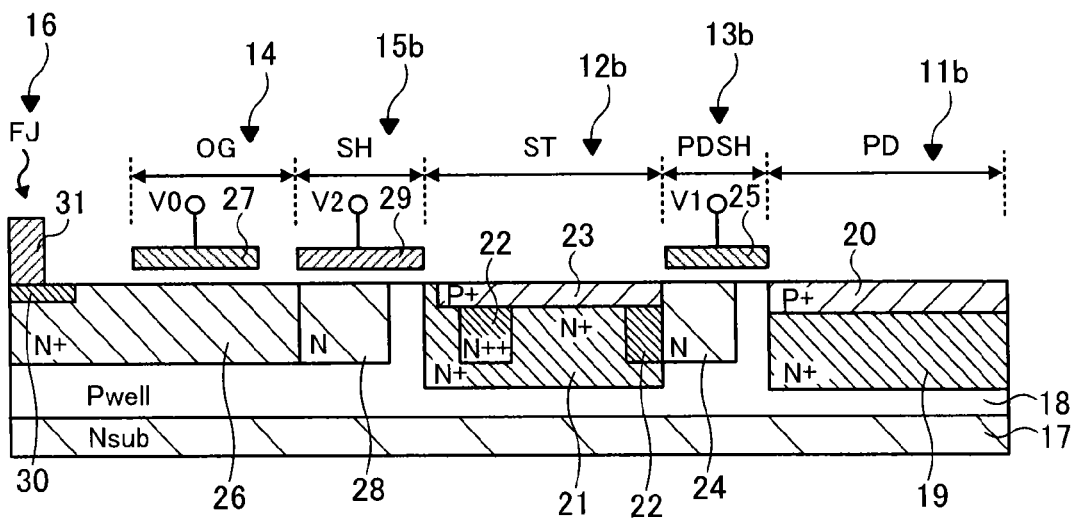
FIG. 2 is a cross-sectional view of the solid-state imaging device along a dashed-dotted line A-A' in FIG. 1.

FIG. 2 is a cross-sectional view of the solid-state imaging device along a dashed-dotted line A-A' in FIG. 1. In addition, FIG. 2 illustrates a cross section which passes through the second pixel portion 11b and the second charge accumulation portion 12b as an example of the cross-sectional view of the solid-state imaging device 10 according to the present embodiment.

As illustrated in FIG. 2, the second pixel portion (PD) 11b, the first transfer gate portion (PDSH) 13b, the second charge accumulation portion (ST) 12b, the second transfer gate portion (SH) 15b, the offset gate portion (OG) 14 and the charge detection portion (FJ) 16 are provided on a P-type well layer 18 provided on, for example, an N-type semiconductor substrate 17.

In the second pixel portion 11b, a light receiving layer 19 is provided on a surface of the well layer 18 and in contact with the first transfer gate portion 13b. The light receiving layer 19 is, for example, an N+-type impurity layer.

A shield layer 20 which shields the light receiving layer 19 is provided on the surface of the light receiving layer 19. The shield layer 20 is, for example, a P+-type impurity layer.

In addition, although not illustrated, in the second pixel portion 11b, a second light receiving layer of a planar shape which is, for example, an N++-type impurity layer may be provided at part of the light receiving layer 19 and spaced apart from the first transfer gate portion 13b.

Next, in the second charge accumulation portion 12b, a first charge accumulation layer 21 of a planar shape is provided on the surface of the well layer and in contact with the second transfer gate portion 15b. Further, a second charge accumulation layer 22 is provided at part of the surface of the first charge accumulation layer 21 and spaced apart from the second transfer gate portion 15b. The first charge accumulation layer 21 is, for example, an N+-type impurity layer which has a higher concentration than that of the N+-type light receiving layer 19, and the second charge accumulation layer 22 is the N++-type impurity layer which has a higher concentration than that of the first charge accumulation layer 21.

A shield layer 23 is provided on the surface of this second charge accumulation layer 22 such that part of the shield layer 23 projects toward the first charge accumulation layer 21. The shield layer 23 is an impurity layer which shields at least the second charge layer 22 and is, for example, a P+-type impurity layer. Although this shield layer 23 and the shield layer 20 of the above second pixel portion 11b are preferably provided as illustrated, these shield layers do not necessarily need to be provided.

In addition, by adjusting (decreasing) the concentrations of the shield layers 20 and 23, it is also possible to adjust (increase) electric potentials of the second pixel portion 11b and the second charge accumulation portion 12b.

Figure 3:
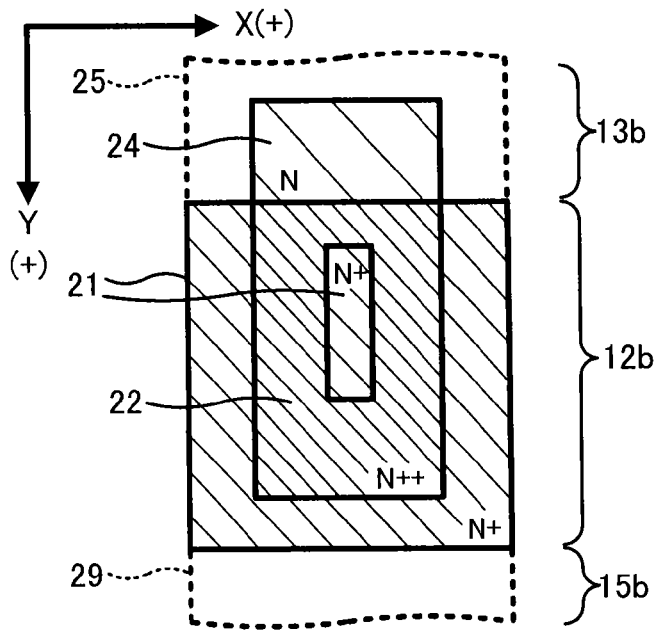
FIG. 3 is a plan view schematically illustrating a second charge accumulation portion and a vicinity of the second charge accumulation portion.

Meanwhile, the second charge accumulation layer 22 of the second charge accumulation portion 12b will be described in more detail. FIG. 3 is a plan view schematically illustrating the second charge accumulation portion 12b and the vicinity of the second charge accumulation portion 12b. In addition, in FIG. 3, a first transfer electrode 25 and a second transfer electrode 29 described below are indicated by dotted lines. Further, a shield layer 23 is omitted.

As illustrated in FIG. 3, the second charge accumulation layer 22 of the second charge accumulation portion 12b is an impurity layer of a ring shape which includes an opening portion in a center region. In addition, the rate of the area of the second charge accumulation layer 22 of the ring shape and the area of the opening portion is, for example, about 3:1.

This second charge accumulation layer 22 is provided by, for example, providing the first charge accumulation layer 21 and then forming, for example, an N-type impurity layer of a ring shape such that N-type impurity layer overlaps part of a region of the first charge accumulation layer 21. As a result, as illustrated in FIGS. 2 and 3, the second charge accumulation layer 22 of the ring shape is provided, and the first charge accumulation layer 21 is exposed from the opening portion of the second charge accumulation layer 22.

Thus, although a position of a deepest portion of the electric potential of the second charge accumulation portion 12b including this layer 22 is placed close to the second transfer gate portion 15b by providing the second charge accumulation layer 22 in a ring shape, the details will be described below.

FIG. 2 will be referred to. In the first transfer gate portion 13b, a first impurity layer for transfer 24 is provided on the surface of the well layer 18. The first impurity layer for transfer 24 is provided spaced apart from the light receiving layer 19 and in contact with the second charge accumulation layer 22 on the surface of the well layer 18. The first impurity layer for transfer 24 is an N-type impurity layer which has, for example, a lower concentration than that of the first charge accumulation layer 21. This first impurity layer for transfer 24 is an impurity layer which well transfers a charge in the first transfer gate portion 13. Hence, when transfer efficiency of the charge in the first transfer gate portion 13b is within an allowable range, the first impurity layer for transfer 24 may not be provided.

In addition, the first impurity layer for transfer 24 can be collectively provided with the second charge accumulation layer 22 by providing part of the N-type impurity layer such that part of the N-type impurity layer sticks out toward the first transfer gate portion 13b when the second charge accumulation layer 22 is provided.

A first transfer electrode 25 is provided on the surface of the well layer 18 including the surface of this first impurity layer for transfer 24. The first transfer electrode 25 controls a depth of an electric potential directly below the first transfer electrode 25 by applying a predetermined voltage V1 to this electrode 25.

Next, in the offset gate portion 14, an offset gate layer 26 is provided on the surface of the well layer 18. The offset gate layer 26 is, for example, an N+-type impurity layer and is provided in a wide range including the offset gate portion 14 and the charge detection portion 16.

An offset gate electrode 27 is provided at part of the surface of this offset gate layer 26. A predetermined constant voltage V0 (for example, V0=0 V) is applied to the offset gate electrode 27 such that the electric potential of the offset gate portion 14 is fixed at a deeper potential than at least that of the second charge accumulation portion 12b. By applying a constant voltage in this way, fluctuation of an electric potential of the charge detection portion 16 due to fluctuation of the electric potential of the second transfer gate portion 15b is suppressed, and accuracy of the charge detection portion 16 to read a signal voltage improves.

In the second transfer gate portion 15b, a second impurity layer for transfer 28 is provided on the surface of the well layer 18. The second impurity layer for transfer 28 is provided spaced apart from the first charge accumulation layer 21 and in contact with the offset gate layer 26 on the surface of the well layer 18. The second impurity layer for transfer 28 is, for example, an N-type impurity layer which has the substantially same impurity concentration as that of the first impurity layer for transfer 24. Similar to the first impurity layer for transfer 24, this second impurity layer for transfer 28 is an impurity layer which well transfers a charge in the second transfer gate portion 15b. Hence, similar to the first transfer gate portion 13b, when transfer efficiency of the charge is within an allowable range, the second impurity layer for transfer 28 may not be provided even in the second transfer gate portion 15b.

A second transfer electrode 29 is provided on the surface of the well layer 18 including the surface of this second impurity layer for transfer 28. The second transfer electrode 29 controls a depth of an electric potential directly below the second transfer electrode 29 by applying a predetermined voltage V2 to this electrode 29.

Next, in the charge detection portion 16, a charge detection layer 30 is provided on the surface of the offset gate layer 26 provided in the charge detection portion 16. The charge detection layer 30 is, for example, an N++-type impurity layer which has a higher concentration than that of the offset gate layer 26. Further, a read electrode 31 which reads a voltage produced in the charge detection layer 30 as a signal voltage is provided at part of the surface of this charge detection layer 30. Although, when the charge is accumulated in the charge detection layer 30, the potential of the charge detection portion 16 causes a predetermined voltage drop corresponding to the accumulation amount of the charge, this voltage drop is read by the read voltage 31 as a signal voltage.

Although a cross-sectional structure of the solid-state imaging device 10 according to the present embodiment has been described above, a cross-sectional structure which passes through the third pixel portion 11c and the third charge accumulation portion 12c is the same as the structures illustrated in FIGS. 2 and 3.

Further, a cross-sectional structure which passes through the first pixel portion 11a and the first charge accumulation portion 12a and a cross-sectional structure which passes through the fourth pixel portion 11d and the fourth charge accumulation portion 12d are the same as the structure illustrated in FIG. 2 except that a second charge accumulation layer 22' of the charge accumulation portions 12a and 12d is not provided in a ring shape.

Figure 4:
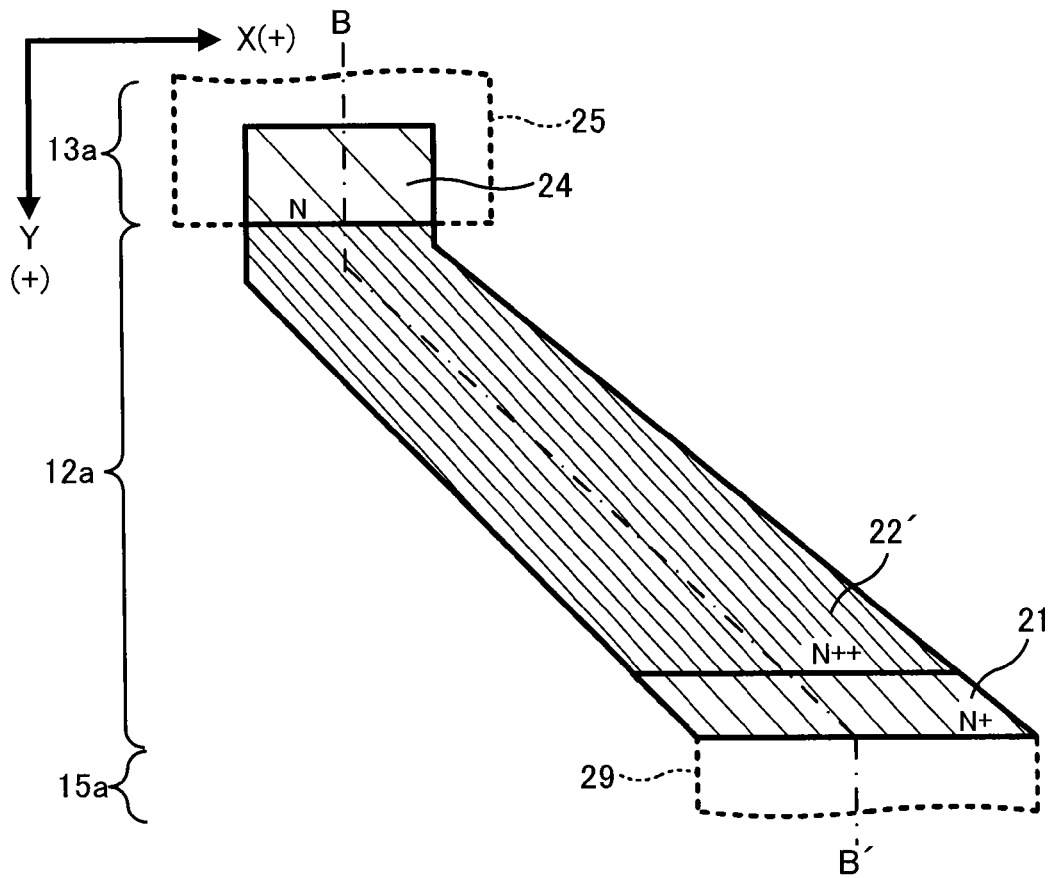
FIG. 4 is a plan view schematically illustrating a first charge accumulation portion and the vicinity of the first charge accumulation portion.
Figure 5:
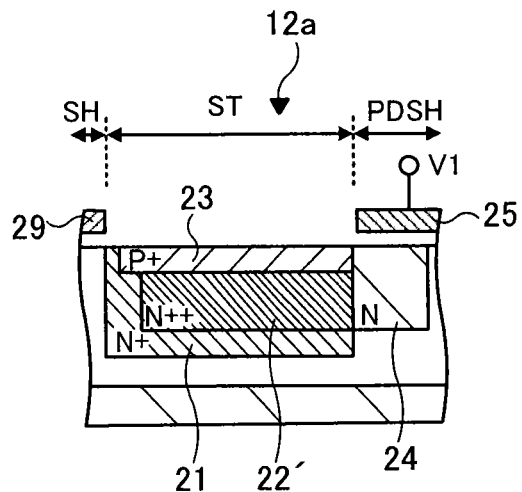
FIG. 5 is a cross-sectional view illustrating a first charge accumulation portion and the vicinity of the first charge accumulation portion along a dashed-dotted line B-B' in FIG. 4.

FIG. 4 is a plan view schematically illustrating the first charge accumulation portion 12a and the vicinity of the first charge accumulation portion 12a. Further, FIG. 5 is a cross-sectional view of the first charge accumulation portion 12a and the vicinity of the first charge accumulation portion 12a along a dashed-dotted line B-B' in FIG. 4. In addition, in FIG. 4, the first transfer electrode 25 and the second transfer electrode 29 are indicated by dotted lines. Further, a shield layer 23 is omitted.

As illustrated in FIGS. 4 and 5, the first charge accumulation layer 21 of the first charge accumulation portion 12a is provided diagonally from the first transfer gate portion 13a toward the second transfer gate portion 15a and is provided to widen from the first transfer gate portion 13a toward the second transfer gate portion 15a.

Further, similar to the first charge accumulation layer 21, the second charge accumulation layer 22' has a planar shape and is provided diagonally from the first transfer gate portion 13a to the second transfer gate portion 15a. Furthermore, similar to the first charge accumulation layer 21, the second charge accumulation layer 22' is provided to widen from the first transfer gate portion 13a to the second transfer gate portion 15a. In addition, the second charge accumulation layer 22' is the same as the second charge accumulation layer 22 of the second and third charge accumulation portions 12b and 12c in that the second charge accumulation layer 22' is provided spaced apart from the second transfer gate portion 15a. Thus, in the first charge accumulation portion 12a, the second charge accumulation layer 22' is not provided in a ring shape and is provided in a planar shape. The reason therefor will be described later.

In addition, the structure of the fourth charge accumulation portion 12d has a shape formed by reversing the left and the right of the structure illustrated in FIG. 4 and the cross-sectional structure of this structure is the same as the structure illustrated in FIG. 5, and therefore will not be described in detail.

Figure 6A:
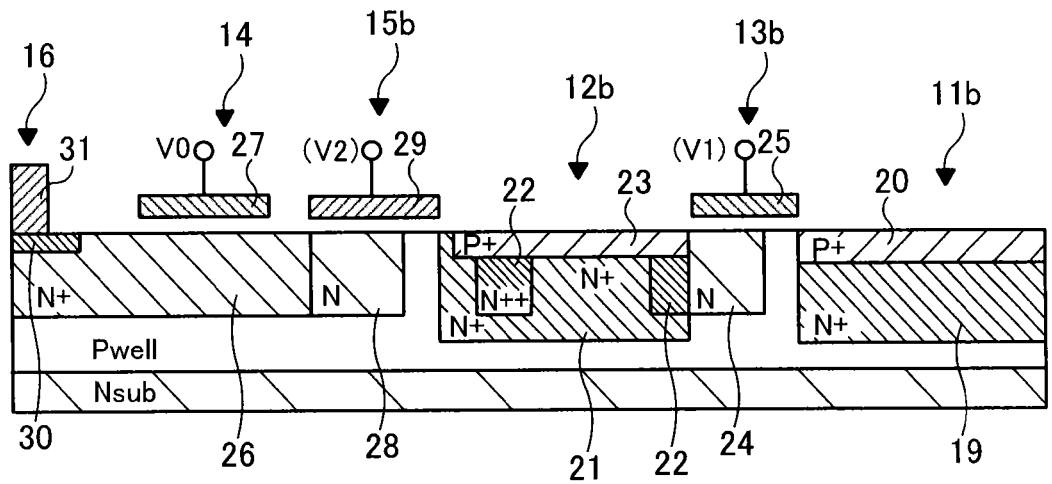
FIGS. 6A and 6B are views for explaining an electric potential formed by the solid-state imaging device according to the first embodiment.
Figure 6B:
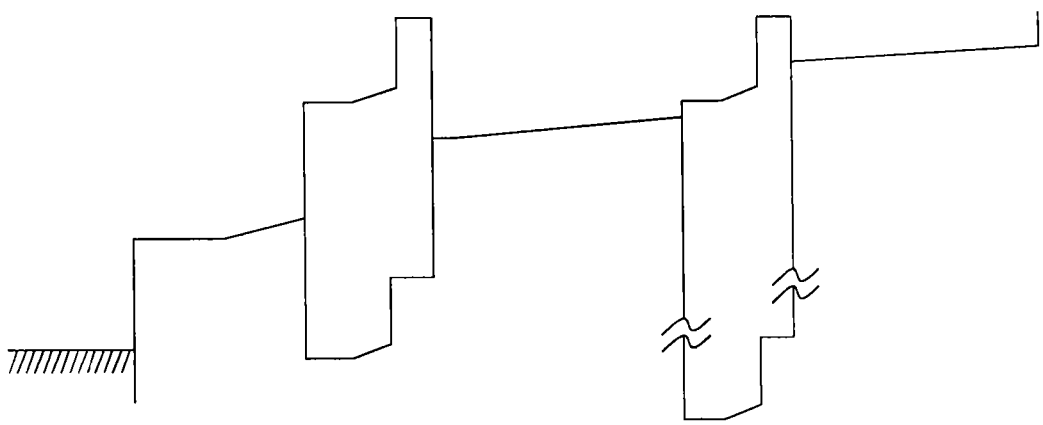

Next, an electric potential in the cross section of the solid-state imaging device 10 provided as described above in FIG. 2 will be described. FIG. 6 is a view for explaining an electric potential formed by the solid-state imaging device 10, and FIG. 6A is a cross-sectional view of the solid-state imaging device 10 illustrated in FIG. 2 and FIG. 6B is a view illustrating an electric potential in the cross section illustrated in FIG. 6A. In addition, an electric potential is deeper in lower part of in FIG. 6B.

As illustrated in FIG. 6A, the light receiving layer 19 is provided in the second pixel portion 11b, and the first charge accumulation layer 21 and the second charge accumulation layer 22 are provided in the second charge accumulation portion 12b. Further, the light receiving layer 19, and the first charge accumulation layer 21 and the second charge accumulation layer 22 are spaced apart from each other. Furthermore, as illustrated in FIG. 6B, electric potentials of the second pixel portion 11b and the second charge accumulation portion 12b are deeper than the electric potential of the first transfer gate portion 13b between the second pixel portion 11b and the second charge accumulation portion 12b.

In the second charge accumulation portion 12b, the first charge accumulation layer 21 and the second charge accumulation layer 22 are provided to have higher concentrations than that of the light receiving layer 19 of the second pixel portion 11b. Hence, as illustrated in FIG. 6B, the electric potential of the second charge accumulation portion 12b is deeper than the electric potential of the second pixel portion 11b.

Further, in the second charge accumulation portion 12b, the second charge accumulation layer 22 which has a higher concentration than that of the first charge accumulation layer 21 is provided spaced apart from the second transfer gate portion 15b on the surface of the first charge accumulation layer 21. Hence, as illustrated in FIG. 6B, the electric potential of the second charge accumulation portion 12b deepens from the first transfer gate portion 13b toward the second transfer gate portion 15b.

In addition, the first impurity layer for transfer 24 is provided in the first transfer gate portion 13b. By providing this impurity layer 24, the electric potential of the first transfer gate portion 13b deepens stepwise from the second pixel portion 11b toward the second charge accumulation portion 12b as illustrated in FIG. 6B. This electric potential makes charge transfer in the first transfer gate portion 13b better.

Further, as illustrated in FIG. 6A, the first charge accumulation layer 21 and the second charge accumulation layer 22 are provided in the second charge accumulation portion 12b, and the offset gate layer 26 is provided in the offset gate portion 14 and the charge detection portion 16. Furthermore, the first charge accumulation layer 21 and the offset gate layer 26 are spaced apart from each other. Still further, electric potentials of the second charge accumulation portion 12b and the offset gate portion 14 are deeper than the electric potential of the second transfer gate portion 15b between the second charge accumulation portion 12b and the offset gate portion 14.

In the offset gate portion 14, an offset gate electrode 27 is provided at part of the surface of the offset gate layer 26, and the predetermined constant voltage V0 (for example, V0=0 V) is applied to this electrode 27 such that the electric potential of the offset gate portion 14 is fixed at a deeper position than that of the second charge accumulation portion 12b. As illustrated in FIG. 6B, the electric potential of the offset gate portion 14 is deeper than the electric potential of the second charge accumulation portion 12b.

In addition, a second impurity layer for transfer 28 is provided in the second transfer gate portion 15b. By providing this impurity layer 28, the electric potential of the second transfer gate portion 15b deepens stepwise from the second charge accumulation portion 12b toward the offset gate portion 14 as illustrated in FIG. 6B. This electric potential makes charge transfer in the second transfer gate portion 15b better.

Further, in the charge detection portion 16, the charge detection layer 30 which has a higher concentration than that of the offset gate layer 26 is provided on the surface of the offset gate layer 26. Hence, the electric potential of the charge detection portion 16 is deeper than that of the offset gate portion 14. By this means, the charge transferred to the offset gate portion 14 gathers in the charge detection portion 16.

Hereinafter, an operation of the solid-state imaging device 10 will be described with reference to FIGS. 6A to 6B.

When light is incident on the second pixel portion 11b, a charge is produced in the light receiving layer 19 by photoelectric conversion. The produced charge is accumulated in the second pixel portion 11b since the electric potential of the first transfer gate portion 13b serves as a barrier.

When a predetermined voltage V1 is applied to the first transfer gate electrode 25 of the first transfer gate portion 13b and the electric potential of the first transfer gate portion 13b is made deeper than the electric potential of the second pixel portion 11b, the charge produced in the second pixel portion 11b is transferred through the first transfer gate portion 13b and reaches the second charge accumulation portion 12b. The transferred charge is accumulated in the second charge accumulation portion 12b since the electric potential of the second transfer gate portion 15b serves as a barrier.

When a predetermined voltage V2 is applied to the second transfer electrode 29 of the second transfer gate portion 15b and the electric potential of the second transfer gate portion 15b is made deeper than the electric potential of the second charge accumulation portion 12b, the charge accumulated in the second charge accumulation portion 12b is transferred through the second transfer gate portion 15b, reaches the offset gate portion 14 and finally gathers in the charge detection portion 16.

When the charge gathers in the charge detection portion 16, the voltage drop corresponding to the amount of the charge accumulated in this portion is caused in the charge detection portion 16. This voltage drop is read as a signal voltage by the read electrode 31. The solid-state imaging device 10 forms an image based on the read signal voltage.

In addition, as described above, the electric potential of the second transfer gate portion 15b fluctuates to transfer the charge. Hence, if the charge detection portion 16 is connected to the second transfer gate portion 15b, the electric potential of the charge detection portion 16 also fluctuates according to fluctuation of the electric potential of the second transfer gate portion 15b. When the electric potential of the charge detection portion 16 fluctuates, accuracy to read a signal voltage decreases.

By contrast with this, as in the present embodiment, when the offset gate portion 14 of the fixed electric potential is provided between the second transfer gate portion 15b and the charge detection portion 16, even if the electric potential of the second transfer gate portion 15b fluctuates, the electric potential of the offset gate portion 14 is fixed, so that fluctuation of the electric potential of the charge detection portion 16 is suppressed. As a result, accuracy to read a signal voltage improves. For this reason, a constant voltage is applied to the offset gate portion 14.

By providing the second accumulation layer 22 of the second and third charge accumulation portions 12b and 12c in a ring shape in the solid-state imaging device 10 which operates in this way, the voltage to be applied to the second transfer electrode 29 is converted into a low voltage. A reason for this will be specifically described below.

Figure 7A:
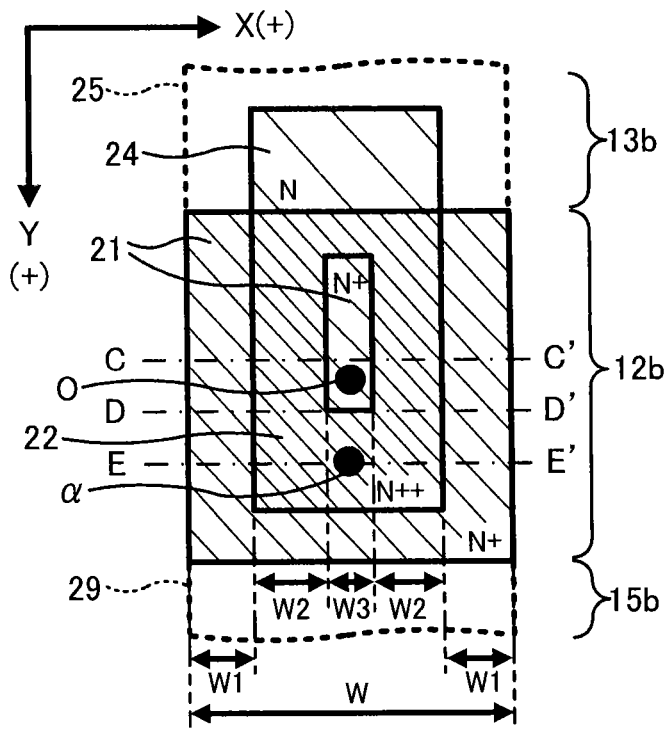
FIGS. 7A to 7D are views for explaining an electric potential formed in the second charge accumulation portion of the solid-state imaging device according to the first embodiment.
Figure 7B:
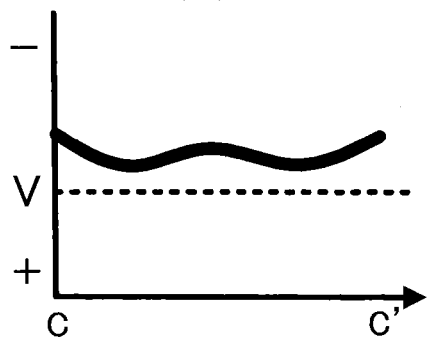
Figure 7C:
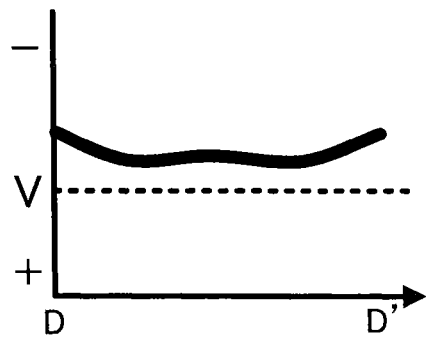
Figure 7D:
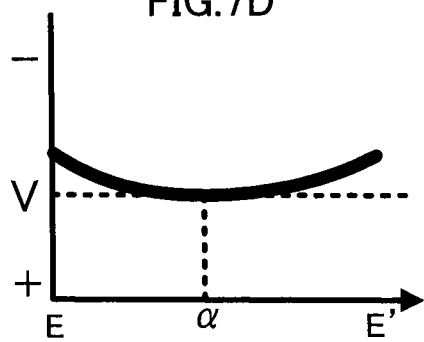

FIG. 7A to 7D are views for explaining an electric potential formed in the second charge accumulation portion 12b of the solid-state imaging device 10 according to the embodiment, and FIG. 7A is a plan view of the second charge accumulation portion 12b illustrated in FIG. 3 and FIGS. 7B, 7C and 7D illustrate an electric potential in each cross section of the second charge accumulation portion 12b. In addition, FIG. 7B illustrates an electric potential in the cross section along a dashed-dotted line C-C', FIG. 7C illustrates an electric potential in a cross section along a dashed-dotted line D-D' and FIG. 7D illustrates an electric potential in a cross section along a dashed-dotted line E-E' in FIG. 7A. In addition, the electric potential is deeper in lower part in FIGS. 7B, 7C and 7D.

As illustrated in FIG. 7A, by providing the second charge accumulation layer 22 in a ring shape, a width W1 of a center region of the second charge accumulation layer 22 becomes narrower than an entire width W of the second charge accumulation layer 22. The second charge accumulation layer 22 has a sufficiently wide width W in an end portion region on the second transfer gate portion 15b side of the second charge accumulation layer 22, and therefore is hardly influenced by a narrow channel effect. In this case, the electric potential of the second charge accumulation portion 12b including the end portion region of the second charge accumulation portion 22 is V (FIG. 7D).

Meanwhile, in the center region of the second charge accumulation layer 22, the width W1 of the first charge accumulation layer 21 which is exposed from the outer periphery of the second charge accumulation layer 22 and widths W2 and W3 of the second charge accumulation layer 22 are narrower than the width W of the end portion region, and the second charge accumulation portion 12b of the second charge accumulation layer 22 is more likely to be influenced by a narrow channel effect and has a shallow electric potential. Hence, the electric potential of the second charge accumulation portion 12b including the center region of the second charge accumulation layer 22 is shallower than V (FIGS. 7B and 7C).

Thus, by providing the second charge accumulation layer 22 in the ring shape, it is possible to shift a position α (FIG. 7A) of a deepest portion of the electric potential of the second charge accumulation portion 12b closer to a direction of the second transfer gate portion 15b than a center portion O of the second charge accumulation layer 22. That is, the position α of the deepest portion of the electric potential can be placed close to the second transfer gate portion 15b.

Figure 8A:
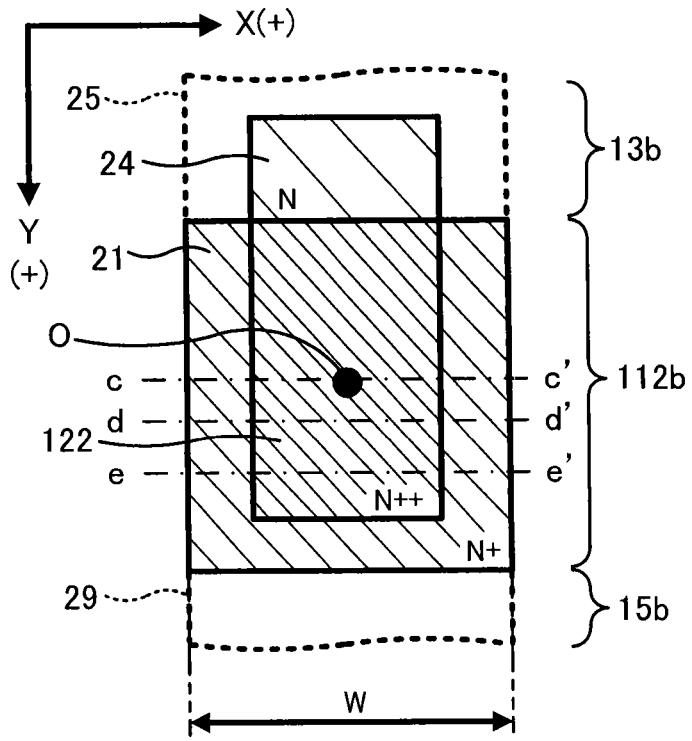
FIGS. 8A to 8D are views for explaining an electric potential formed in a second charge accumulation portion of a related art solid-state imaging device.
Figure 8B:
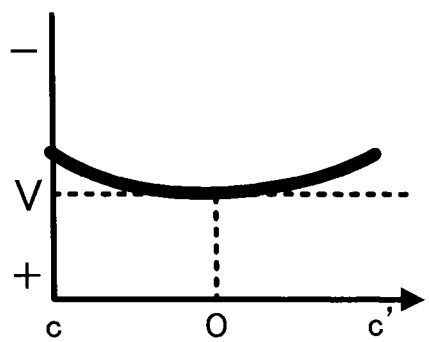
Figure 8C:
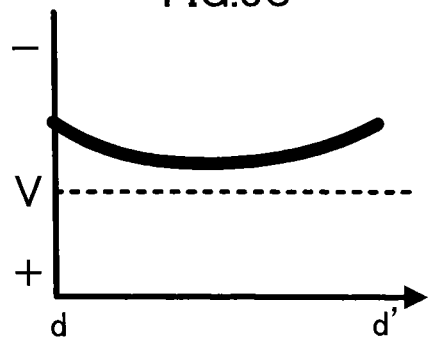
Figure 8D:
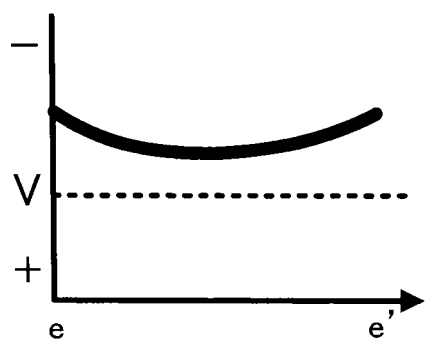

Next, a second charge accumulation portion of a related art solid-state imaging device will be described. FIGS. 8A to 8D are views for explaining an electric potential formed in a second charge accumulation portion of a related art solid-state imaging device, and FIG. 8A is a plan view of the second charge accumulation portion of the related art solid-state imaging device and FIGS. 8B, 8C and 8D are views illustrating an electric potential in each cross section of the second charge accumulation portion illustrated in FIG. 8A. In addition, FIG. 8B illustrates an electric potential in the cross section along the dashed-dotted line c-c' in FIG. 8A, FIG. 8C illustrates an electric potential in a cross section along the dashed-dotted line d-d' in FIG. 8A and FIG. 8D illustrates an electric potential in the cross section along the dashed-dotted line e-e' in FIG. 8D. In addition, in FIG. 8A, the same portions as those of the structure in FIG. 7A are assigned the same reference numerals in those in FIG. 7A. Further, the electric potential is deeper in lower part in FIGS. 8B, 8C and 8D.

As illustrated in FIG. 8A, when a second charge accumulation layer 122 of a planar shape is provided in a second charge accumulation portion 112b, the width W of the center region of the second charge accumulation layer 122 and the width W of the end portion region of the second charge accumulation layer 122 both match with the entire width W of the second charge accumulation layer 122 and has a sufficiently wide width W. Hence, the entire second charge accumulation layer 122 is hardly influenced by a narrow channel effect. Hence, an electric potential of the second charge accumulation portion 112b is deepest at a position which substantially matches with a center O of the second charge accumulation layer 122 (FIG. 8B), and becomes shallower as the distance from the center O (FIGS. 8C and 8D). That is, in the second charge accumulation portion 112b of the related art solid-state imaging device, the position of the deepest portion of an electric potential is a position far from the second transfer gate portion 15b compared to the present embodiment.

As described above with reference to FIGS. 7 and 8 above, by providing the second charge accumulation layer 22 of the second charge accumulation portion 12b in a ring shape, it is possible to place the deepest portion of the electric potential of the second charge accumulation portion 12b close to the second transfer gate portion 15b. As a result, the voltage V2 to be applied to the second transfer electrode 29 of the second transfer gate portion 15b can be converted into a low voltage.

That is, as described above, the charge to be accumulated in this region is transferred by applying the voltage V2 to the second transfer electrode 29 of the second transfer gate portion 15b. Meanwhile, as illustrated in each FIG. 8A to 8D, the position of the deepest portion of the electric potential of the second charge accumulation portion 112b is the center portion of the second charge accumulation layer 122, the charge is trapped in the center portion of this second charge accumulation layer 122. The position at which the charge is trapped in this way is far from the second transfer gate portion 15b, and therefore a high voltage needs to be applied to the second transfer electrode 29 to transfer the trapped charge (to satisfy predetermined residual image characteristics).

By contrast with this, in the present embodiment, as illustrated in each FIG. 7A to 7D, the position α of the deepest portion of the electric potential of the second charge accumulation portion 12b is in the end portion region of the second charge accumulation layer 22, and the charge is trapped in this region. However, the position at which the charge is trapped as described above is a position close to the second transfer gate portion 15b compared to a related art solid-state imaging device. Consequently, it is possible to convert a voltage to be applied to the second transfer electrode 29 into a low voltage to transfer the trapped charge (to satisfy predetermined residual image characteristics).

In addition, in the solid-state imaging device 10 according to the present embodiment, the second charge accumulation layer 22 of the third charge accumulation portion 12c is also provided in a ring shape for the same reason. However, the second charge accumulation layer 22' of the first and fourth charge accumulation portions 12a and 12d is not provided in a ring shape, and is provided in a planar shape. This reason will be described below.

Figure 9A:
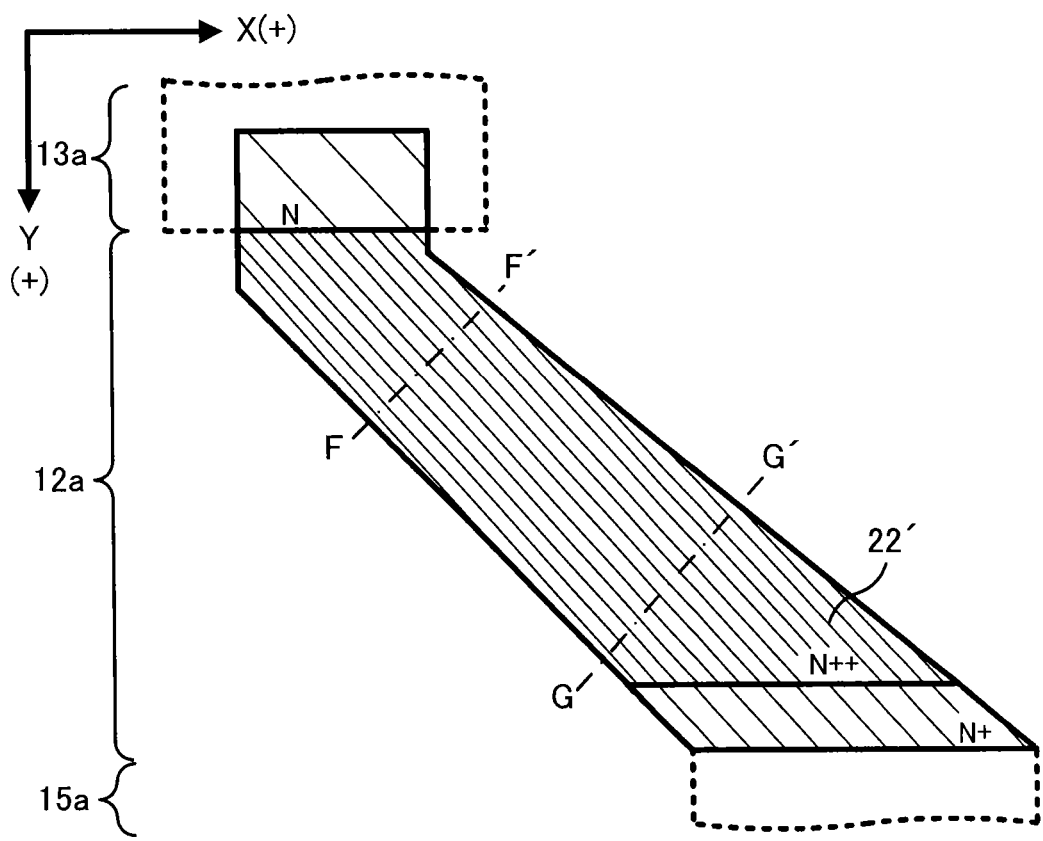
FIGS. 9A to 9C are views for explaining an electric potential formed in the first charge accumulation portion of the solid-state imaging device according to the first embodiment.
Figure 9B:
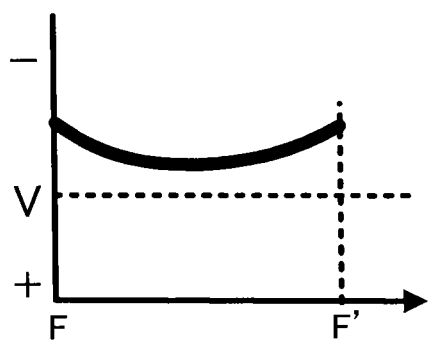
Figure 9C:
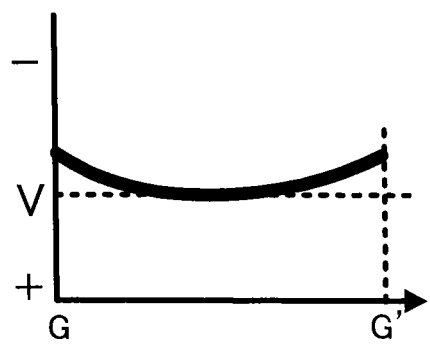

FIGS. 9A to 9C are views for explaining an electric potential formed in the first charge accumulation portion 12a of the solid-state imaging device 10 according to the embodiment, and FIG. 9A is a plan view of the first charge accumulation portion 12a and FIGS. 9B and 9C are views illustrating an electric potential in each cross section of the second charge accumulation portion 12a. In addition, FIG. 9B illustrates an electric potential in a cross section along a dashed-dotted line F-F' in FIG. 9A and FIG. 9C illustrates an electric potential in a cross section along a dashed-dotted line G-G' in FIG. 9A. In addition, the electric potential is deeper in lower part in FIGS. 9B and 9C.

As illustrated in FIG. 9A, the second charge accumulation layer 22' of the first charge accumulation portion 12a is provided to widen from the first transfer gate portion 13a toward the second transfer gate portion 15a. In an end portion region (this region is referred to as a first step portion region below) on the second transfer gate portion 15a side of the second charge accumulation layer 22', the second charge accumulation layer 22' has a sufficiently wide width and therefore is hardly influenced by a narrow channel effect. In this case, the electric potential of the second charge accumulation portion 12a including the first step portion region of the second charge accumulation layer 22' is V (FIG. 9C).

Meanwhile, the end portion region (this region is referred to as a second step portion region below) on the first transfer gate portion 13a side of the second charge accumulation layer 22' has a narrower width than that of a first end portion region of the second charge accumulation layer 22' and therefore is likely to be influenced by a narrow channel effect. Hence, the electric potential of the second charge accumulation portion 12a including the second step portion region of the second charge accumulation layer 22' is shallower than the electric potential (V) of the second charge accumulation portion 12a including the first step portion region of the second charge accumulation layer 22' (FIG. 9B).

Thus, the electric potential of the first charge accumulation portion 12a including the second charge accumulation layer 22' is strongly influenced by a narrow channel effect at a position closer to the first transfer gate portion 13a, and becomes shallow (FIGS. 9B and 9C). Hence, even when the second charge accumulation layer 22' is not provided in a ring shape, the electric potential of the first charge accumulation portion 12a is formed to deepen from the first transfer gate portion 13a toward the second transfer gate portion 15a. Thus, in the first charge accumulation portion 12a, a gradient of an electric potential whose charge to be transferred in this region is smoothly transferred is provided, and therefore the second charge accumulation layer 22' is not provided in a ring shape.

In addition, the second charge accumulation layer 22' of the fourth charge accumulation portion 12d is not provided in a ring shape for the same reason.

Meanwhile, it is also thought that the second charge accumulation layer 22 of the second and third charge accumulation portions 12b and 12c only needs to be provided to widen from the first transfer gate portions 13b and 13c toward the second transfer gate portions 15b and 15c to have the same gradient of an electric potential as that of the second charge accumulation layer 22' of the first and fourth charge accumulation portions 12a and 12d. However, as illustrated in FIG. 1, the second and third charge accumulation portions 12b and 12c have shorter distances than those of the first and fourth charge accumulation portions 12a and 12d. Hence, even when the second charge accumulation layer 22 of the second and third charge accumulation portions 12b and 12c is provided to widen in a charge transfer direction similar to the second charge accumulation layer 22' of the first and fourth charge accumulation portions 12a and 12d, it is difficult to obtain an electric potential which deepens toward the charge transfer direction. Hence, the second charge accumulation layer 22 of the second and third charge accumulation portions 12b and 12c needs to be provided in a ring shape as described above.

In the solid-state imaging device 10 according to the present embodiment described above, the second charge accumulation layer 22 of the second and third charge accumulation portions 12b and 12c is provided in a ring shape. Hence, it is possible to convert a voltage to be applied to the second transfer electrode 29 into a low voltage without deteriorating residual image characteristics compared to the related art solid-state imaging device which is provided with the second charge accumulation layer 122 of a planar shape as illustrated in FIG. 8A. As a result, it is possible to expand a voltage margin of a voltage to be applied to this electrode 29. As a result, a residual image characteristic margin improves, and a yield rate improves.

Further, by providing the second charge accumulation layer 22 of the second and third charge accumulation portions 12b and 12c in a ring shape, the solid-state imaging device 10 according to the present embodiment can well transfer the charge to be accumulated in these regions without increasing the voltage to be applied to the second transfer electrode 29 even when the charge amount to be accumulated in the second and third charge accumulation portions 12b and 12c is low (when luminance is low). As a result, it is possible to maintain linearity of the amount of received light of each of the pixel portions 11a to 11d and the voltage read by the charge detection portion 16 when the amount of received light is low, and form a good image even when the amount of received light is low.

In addition, the solid-state imaging device 10 according to the present embodiment provides the above effect by placing the positions of deepest portions of electric potentials of the second and third charge accumulation portions 12b and 12c close to the second transfer gate portions 15b and 15c. Meanwhile, as means which places the positions of the deepest portions of the electric potentials of the second and third charge accumulation portions close to the second transfer gate portion, there is means which additionally provides an impurity layer at part of the surface of the second charge portion which is close to the second transfer gate portion. However, in some cases, this means not only increases the number of manufacturing steps but also causes a potential barrier or dip at a position which is close to the second transfer gate portion due to misalignment of the additionally provided impurity layer and the second charge accumulation layer. In this case, it is necessary to apply a high voltage to the second transfer gate portion to maintain predetermined residual image characteristics. Hence, this means cannot necessarily expand a voltage margin of the voltage to be applied to the second transfer gate electrode. Therefore, this means decreases a yield rate compared to the solid-state imaging device 10 according to the present embodiment, and therefore is not desirable means.

Second Embodiment

Next, a solid-state imaging device according to the second embodiment will be described. In addition, a plan view of an entire structure of the solid-state imaging device according to the second embodiment is the same as that in FIG. 1, and the operation is the same as the operation described with reference to FIGS. 6A to 6C. Hence, the plan view and the operation will not be described, and differences from the first solid-state imaging device 10 will be described.

Figure 10:
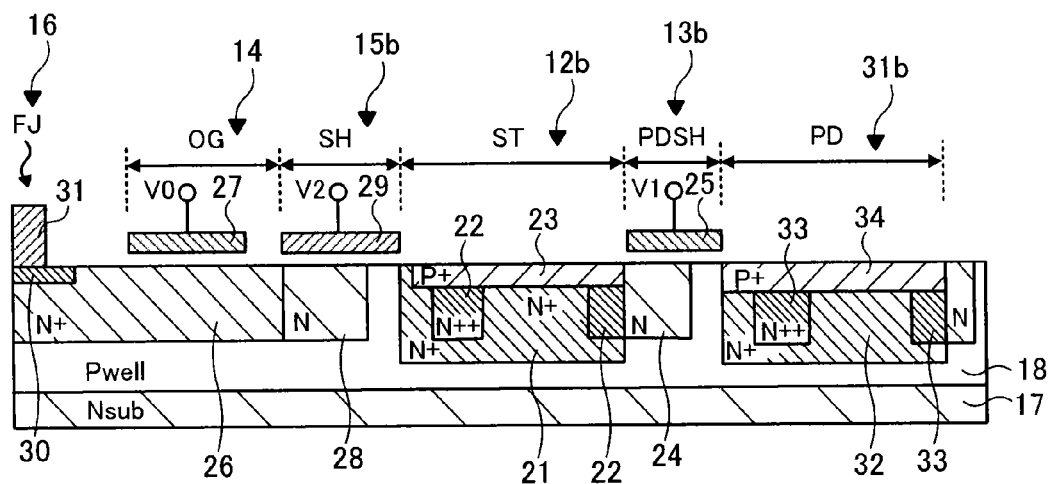
FIG. 10 is a cross-sectional view of a solid-state imaging device according to a second embodiment corresponding to FIG. 2.
Figure 11:
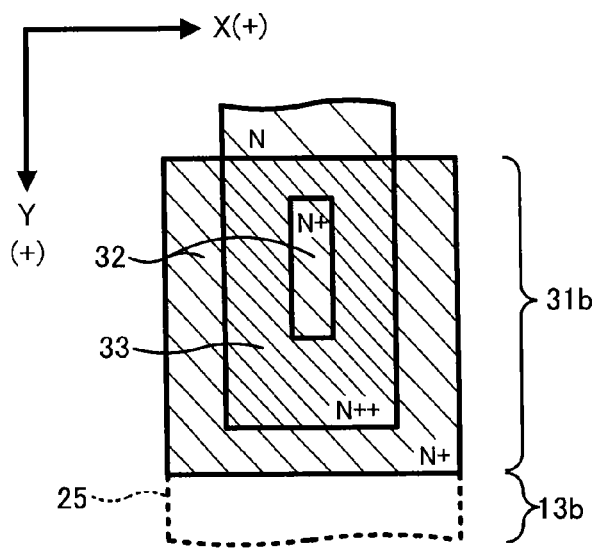
FIG. 11 is a plan view schematically illustrating a second pixel portion and a vicinity of the second pixel portion.

FIG. 10 is a cross-sectional view of the solid-state imaging device according to the second embodiment corresponding to FIG. 2, and FIG. 11 is a plan view enlarging a second pixel portion of this solid-state imaging device. In addition, in FIG. 11, a first transfer electrode 25 is indicated by a dotted line. Further, a shield layer 34 is omitted.

As illustrated in FIGS. 10 and 11, the solid-state imaging device according to the second embodiment adopts a different structure of a second pixel portion 31b compared to a solid-state imaging device 10 according to the first embodiment. That is, in the second pixel portion 31b, a first light receiving layer 32 of a planar shape which is, for example, an N+-type impurity layer is provided on the surface of a well layer 18. This first light receiving layer 32 is provided similar to a light receiving layer 19 (FIG. 2) of the solid-state imaging device 10 according to the first embodiment.

A second light receiving layer 33 which is, for example, an N++-type impurity layer is provided on the surface of this first light receiving layer 32 and spaced apart from the first transfer gate portion 13b. As illustrated in FIG. 11, the second light receiving layer 33 is an impurity layer of a ring shape which includes an opening portion in the center region similar to the second charge accumulation layer 22 of the second charge accumulation portion 12b. In addition, a rate of an area of the second light receiving layer 33 of the ring shape and the area of the opening portion is, for example, about 3:1.

This second light receiving layer 33 is provided by, for example, providing the first light receiving layer 32 and forming an N-type impurity layer of a ring shape such that the N-type impurity layer overlaps part of a region of the first light receiving layer 32. As a result, as illustrated in FIGS. 10 and 11, the second light receiving layer 33 of the ring shape is provided, and the first light receiving layer 32 is exposed from the opening portion of the second light receiving layer 33.

Thus, by providing the second light receiving layer 33 in a ring shape, it is possible to place the position of a deepest portion of the electric potential of the second pixel portion 31b including this layer 33 close to the first transfer gate portion 13b. In addition, the reason why the position of the deepest portion of the electric potential of the second charge accumulation portion 12b can be placed close to the second transfer gate portion 15b by providing the second charge accumulation layer 22 in the ring shape is the same, and therefore will not be described.

FIG. 10 will be referred to. In the second pixel portion 31b which includes the first and second light receiving layers 32 and 33, a shield layer 34 is provided on the surface of the second light receiving layer 33 such that part of the shield layer 34 sticks out toward the first light receiving layer 32. The shield layer 34 is an impurity layer which shields at least the second light receiving layer 33, and is, for example, a P+-type impurity layer. In addition, although this shield layer 34 is preferably provided as illustrated, the shield layer 34 does not necessarily need to be provided.

Although the structure of the second pixel portion 31b has been described above, the second light receiving layer 33 of the ring shape may be provided similar to the second pixel portion 31b even in other pixel portions (first, third and fourth pixel portions).

In a solid-state imaging device according to the present embodiment described above, the second charge accumulation layer 22 of the second and third charge accumulation portions 12b and 12c is provided in a ring shape. Consequently, it is possible to convert a voltage to be applied to the second transfer electrode 29 into a low voltage without deteriorating residual image characteristics, and expand a voltage margin of the voltage to be applied to this electrode 29 compared to the related art solid-state imaging device. As a result, a residual image characteristic margin improves, and a yield rate improves.

Further, by providing the second charge accumulation layer 22 of the second and third charge accumulation portions 12b and 12c in a ring shape even in the solid-state imaging device according to the present embodiment, it is possible to well transfer the charge to be accumulated in these regions without increasing the voltage to be applied to the second transfer electrode 29 even when the charge amount to be accumulated in the second and third charge accumulation portions 12b and 12c is low (when luminance is low). As a result, it is possible to maintain linearity of the amount of received light in each pixel portion and the voltage read by the charge detection portion 16 even when the amount of received light is low, and form a good image even when the amount of received light is low.

Further, in the solid-state imaging device according to the present embodiment, the second light receiving layer 33 of a ring shape is provided in the second pixel portion 31b and the second light receiving layer of a ring shape is also provided in each of the other pixel portions likewise. Consequently, it is possible to convert the voltage to be applied to the first transfer electrode 25 into a low voltage without deteriorating residual image characteristics, and expand a voltage margin of a voltage to be applied to this electrode 25 compared to the related art solid-state imaging device. As a result, the residual image characteristics margin improves and the yield rate improves compared to the solid-state imaging device 10 according to the first embodiment.

Further, by providing the second light receiving layer of a ring shape in each pixel portion including the second pixel portion 31b, it is possible to well transfer the charge produced in these regions without increasing the voltage to be applied to the first transfer electrode 25 even when the charge amount of the charge produced in each pixel portion is low (when luminance is low). As a result, it is possible to maintain linearity of the amount of received light in each pixel portion and the voltage read by the charge detection portion 16 even when the amount of received light is low. Consequently, it is possible to form a better image than that of the solid-state imaging device 10 according to the first embodiment even when the amount of received light is low.

In addition, according to the second embodiment, the second charge accumulation layer 22 of a ring shape is provided in the second and third charge accumulation portions 12b and 12c and, in addition, the second light receiving layer 33 of a ring shape is also provided in each pixel portion including the second pixel portion 31b. However, the second light receiving layer 33 may be provided only in a predetermined pixel portion. Further, the second light receiving layer 33 of a ring shape may be provided in each pixel portion without providing the second charge accumulation layer 22 of the ring shape in the second and third charge accumulation portions 12b and 12c. That is, a second charge accumulation layer of a planar shape may be provided in the second and third charge accumulation portions 12b and 12c or the second charge accumulation layer 22 itself may not be provided.

Although the solid-state imaging devices according to the first and second embodiments described above relate to a CCD image sensor, the present invention is applicable to a CMOS image sensor.

Third Embodiment

Figure 12:
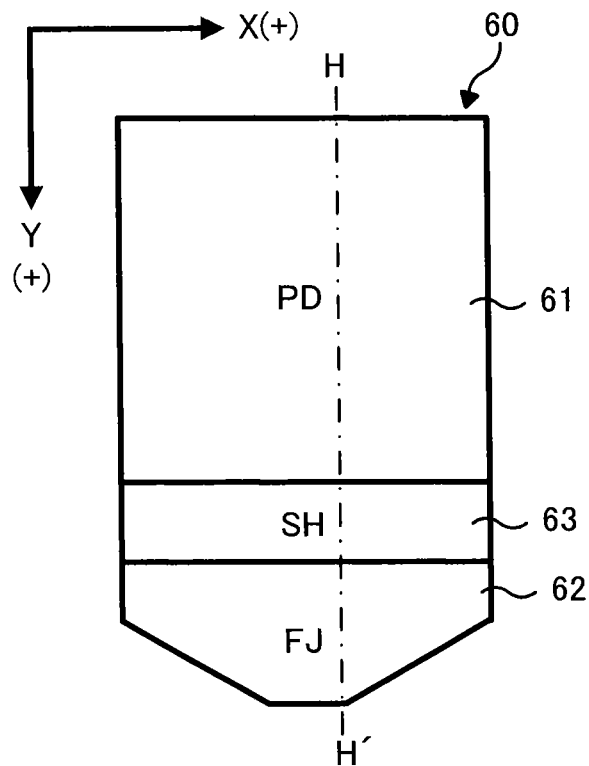
FIG. 12 is a plan view schematically illustrating main components of a solid-state imaging device according to a third embodiment.

FIG. 12 is a plan view schematically illustrating main components of a solid-state imaging device according to the third embodiment. In addition, the solid-state imaging device illustrated in FIG. 12 is part of a CMOS image sensor. An actual CMOS image sensor is formed by aligning a plurality of structures illustrated in FIG. 12 in a grid pattern.

As illustrated in FIG. 12, in a solid-state imaging device 60, a transfer gate portion (SH) 63 is formed between a pixel portion (PD) 61 and a charge detection portion (FJ) 62. A pixel portion 61 and a charge detection portion 62 operate similar to each of pixel portions 11a to 11d and 31b and a charge detection portion 16 of the solid-state imaging devices according to the first and second embodiments. By contrast with this, the transfer gate portion (SH) 63 reads the charge produced in the pixel portion 61, and transfers the read charge to the charge detection portion 62.

Figure 13:
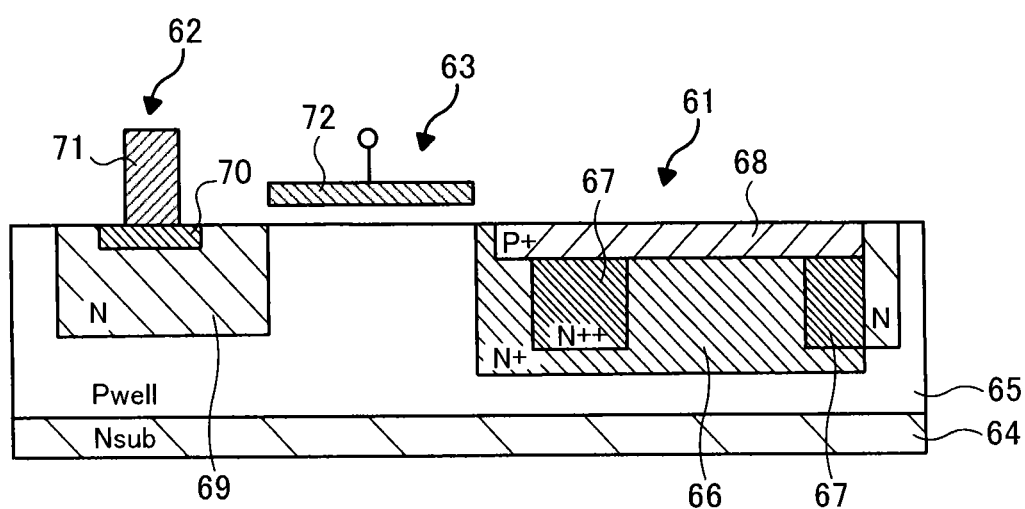
FIG. 13 is a cross-sectional view of the solid-state imaging device along a dashed-dotted line H-H' in FIG. 12.

FIG. 13 is a cross-sectional view of the solid-state imaging device 60 along a dashed-dotted line H-H' in FIG. 12. As illustrated in FIG. 13, the pixel portion 61, the transfer gate portion 63 and the charge detection portion 62 are provided on a P-type well layer 65 provided on, for example, an N-type semiconductor substrate 64.

In a pixel portion 61, a first light receiving layer 66 is provided on a surface of the well layer 65 and in contact with the transfer gate portion 63. The first light receiving layer 66 is, for example, an N+-type impurity layer which is provided in a planar shape. Further, a second light receiving layer 67 which is, for example, an N++-type impurity layer is provided on the surface of this first light receiving layer 66 and spaced apart from the transfer gate portion 63. Further, the semiconductor substrate 64 is a P-type, and the well layer 65 can also be an N-type.

Figure 14:
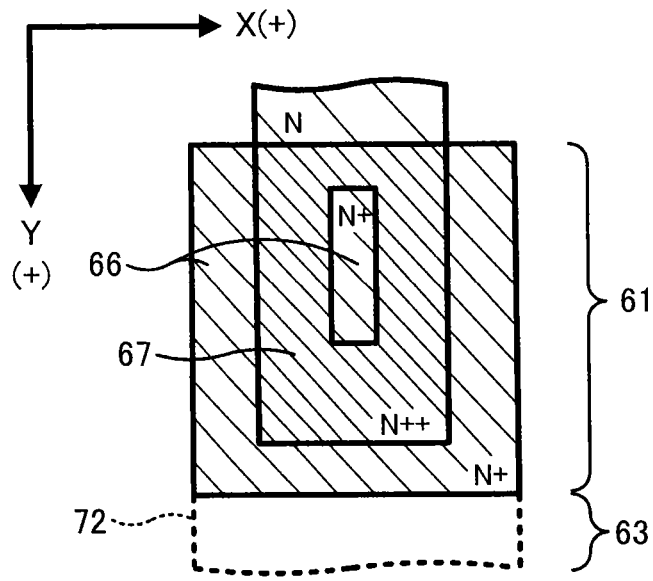
FIG. 14 is a plan view schematically illustrating a pixel portion and a vicinity of the pixel portion.

FIG. 14 is a plan view schematically illustrating the pixel portion 61 and the vicinity of the pixel portion 61. In addition, in FIG. 14, a transfer electrode 72 is indicated by a dotted line. Further, a shield layer 68 is not illustrated.

As illustrated in FIG. 14, the second light receiving layer 67 is an impurity layer of a ring shape which includes an opening portion in a center region. In addition, the rate of an area of the second light receiving layer 67 of a ring shape and an area of the opening portion is, for example, about 3:1.

This second light receiving layer 67 is provided by, for example, providing the first light receiving layer 66 and forming, for example, an N-type impurity layer such that the N-type impurity layer overlaps part of a region of the first light receiving layer 66. As a result, as illustrated in FIGS. 13 and 14, the second light receiving layer 67 of a ring shape is provided, and the first light receiving layer 66 is exposed from the opening portion of the second light receiving layer 67.

Thus, by providing the second light receiving layer 67 in a ring shape, it is possible to place a position of a deepest portion of an electric potential of the pixel portion 61 including this layer 67 close to the transfer gate portion 63. In addition, this reason is the same as the reason that it is possible to place the position of the deepest portion of the electric potential of the second charge accumulation portion 12b close to the second transfer gate portion 15b by providing the second charge accumulation layer 22 in a ring shape in the solid-state imaging device 10 according to the first embodiment.

FIG. 13 will be referred to. In the pixel portion 61 including the first and second light receiving layers 66 and 67, a shield layer 68 is provided on the surface of the second light receiving layer 67 such that part of the shield layer 68 sticks out toward the first light receiving layer 66. The shield layer 68 is an impurity layer which shields at least the second light receiving layer 67, and is, for example, a P+-type impurity layer. In addition, although this light receiving layer 67 is preferably provided as illustrated, the light receiving layer 67 may not necessarily need to be provided.

Next, in the charge detection portion 62, a first charge detection layer 69 which is, for example, an N-type impurity layer is provided on the surface of the well layer 65. Further, a second charge detection layer 70 which is an impurity layer which has a higher concentration than that of the first charge detection layer 69 is provided on part of the surface of this first charge detection layer 69. Further, a read electrode 71 is provided on the surface of the second charge detection layer 70.

In the transfer gate portion 63 between the pixel portion 61 and the charge detection portion 62, a transfer electrode 72 is provided on the surface of the well layer 65.

In addition, although an offset gate portion is not provided in the solid-state imaging device 60 according to the present embodiment, an offset gate portion may be provided between the transfer gate portion 63 and the charge detection portion 62.

Even this solid-state imaging device 60 operates in basically the same way as the solid-state imaging devices according to the first and second embodiments. That is, by applying a predetermined voltage to the transfer electrode 72 and making an electric potential of the transfer gate portion 63 deeper than the electric potential of the pixel portion 61, the charge produced in the pixel portion 61 is transferred to the charge detection portion 62. The charge transferred to the charge detection portion 62 causes the potential of the charge detection portion 62 to drop. This voltage drop is read as a signal voltage by the read electrode 71. The solid-state imaging device 60 forms a signal voltage for forming an image in this way.

In the solid-state imaging device 60 according to the present embodiment described above, the second light receiving layer 67 of a ring shape is provided in the pixel portion 61, so that it is possible to convert a voltage to be applied to the transfer electrode 72 into a low voltage without deteriorating residual image characteristics, and expand a voltage margin of a voltage to be applied to this electrode 72 compared to a related art CMOS solid-state imaging device in which only a first light receiving layer of a planar shape is provided in a pixel portion or a related art CMOS solid-state imaging device in which a second light receiving layer of a planar shape is provided on a surface of a first light receiving layer of a planar shape. As a result, a residual image characteristic margin improves, and a yield rate improves.

Further, the second light receiving layer 67 of a ring shape is provided in the pixel portion 61 in the solid-state imaging device 60 according to the present embodiment, so that it is possible to well transfer a charge produced in these regions without increasing the voltage to be applied to the transfer electrode 72 even when the charge amount of the charge produced in the pixel portion 61 is small (when luminance is low). As a result, it is possible to maintain linearity of the amount of received light in the pixel portion 61 and the voltage read by the charge detection portion 62 even when the amount of received light is low, and form a good image even when the amount of received light is low.

The solid-state imaging devices according to the first to third embodiments described above are applied to, for example, a line sensor. A line sensor to which, for example, the solid-state imaging device 10 according to the first embodiment is applied will be described below as an application example.

Application Example

Figure 15:
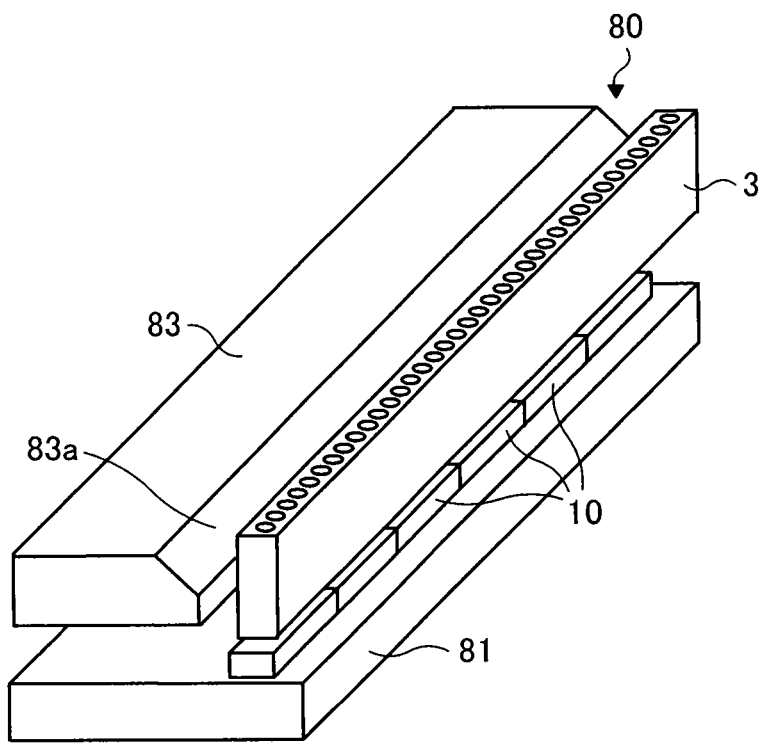
FIG. 15 is a perspective view illustrating a line sensor to which the solid-state imaging device according to the first embodiment is applied.

FIG. 15 is a perspective view illustrating a line sensor to which the first solid-state imaging device 10 is applied. A line sensor 80 includes a circuit substrate 81, a plurality of solid-state imaging devices 10, a selfoc lens array 82 and a light guide body 83. Although not illustrated, these components are arranged in a chassis.

A plurality of solid-state imaging devices 10 is arranged on the circuit substrate 81 adjacently to each other and linearly. Each solid-state imaging device 10 is arranged on the substrate 81 such that a light reception surface of each solid-state imaging device 10 opposes to an output surface of the selfoc lens array 82, and is electrically connected with wires provided in the circuit substrate 81.

In addition, although not illustrated, the circuit substrate 81 includes an image processing circuit which forms an image based on a signal voltage outputted from each solid-state imaging device 10.

The selfoc lens array 82 and the light guide body 83 are arranged above the circuit substrate 81, and are supported by the chassis (not illustrated). The light guide body 83 includes an emission surface 83a which emits light emitted from a light source (not illustrated) such as a LED arranged at an end portion of the light guide body 83, toward document.

The selfoc lens array 82 is arranged above the circuit substrate 81 such that light reflected from the document forms an image in the solid-state imaging device 10. Hence, the light emitted from the emission surface 83a of the light guide body 83 is reflected from the document, is incident on the selfoc lens array 82 and forms an image in the solid-state imaging device 10.

Figure 16:
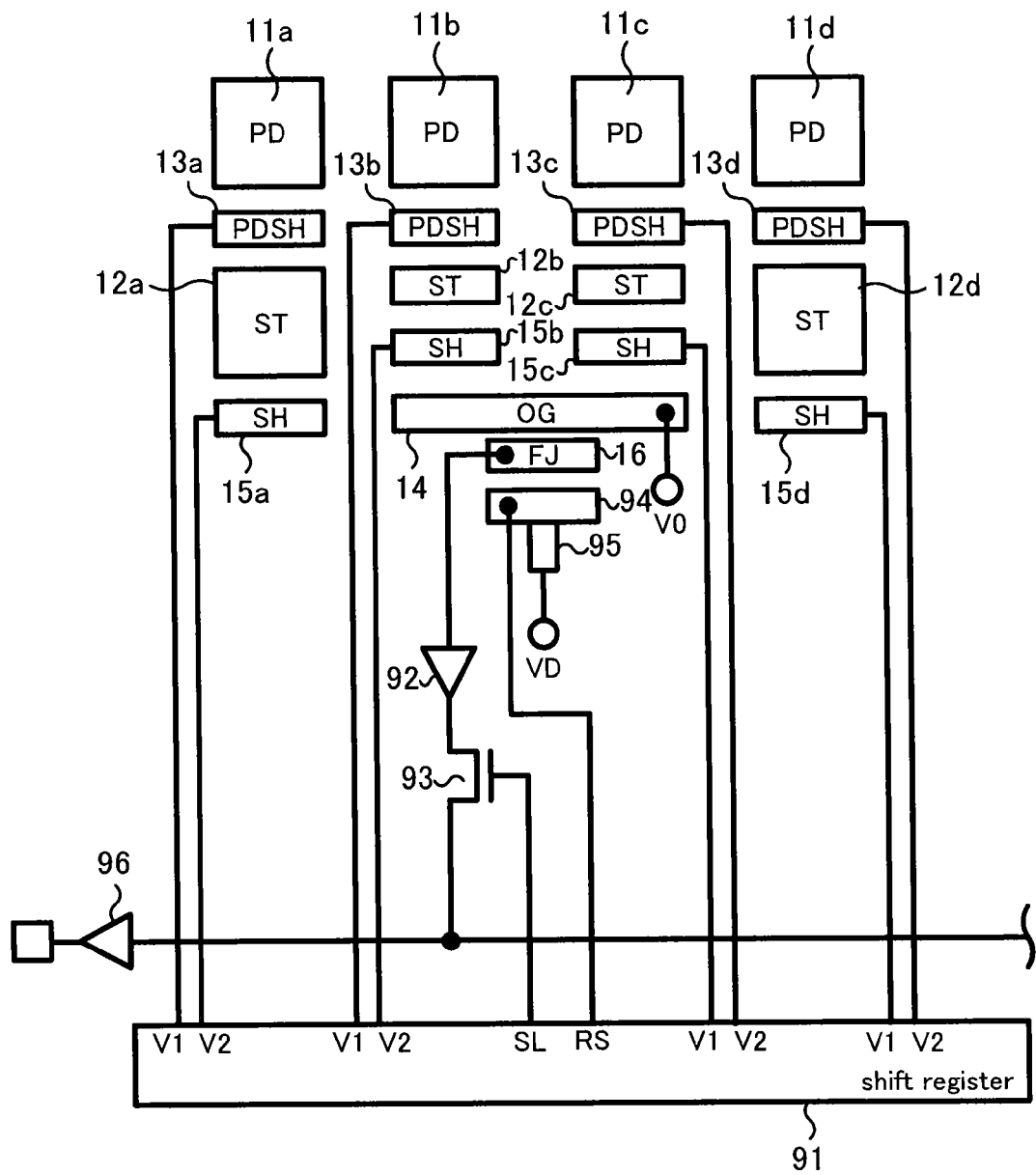
FIG. 16 is a circuit block diagram of one solid-state imaging device which is applied to the line sensor illustrated in FIG. 15.

FIG. 16 is a circuit block diagram of one solid-state imaging device 10 to which this line sensor 80 is applied. In addition, the circuit block diagram illustrated in FIG. 16 is a circuit block diagram of one cell provided in the solid-state imaging device 10, and the circuit block diagram illustrated in FIG. 16 is aligned in an actual solid-state imaging device.

As illustrated in FIG. 16, each of first transfer gate portions 13a to 13d and each of second transfer gate portions 15a to 15d are connected to a shift register 91. A gate pulse V1 outputted from the shift register 91 is inputted at a desired timing to each of the first transfer gate portions 13a to 13d, and a gate pulse V2 outputted from the shift register 91 is inputted at a desired timing to each of the second transfer gate portions 15a to 15d.

When, for example, the gate pulse V1 is inputted at the same timing to the four first transfer gate portions 13a to 13d and the gate pulse V2 is inputted at the same timing to the four second transfer gate portions 15a to 15d, the charge produced in each of the pixel portions 11a to 11d is transferred to the charge detection portion 16 and accumulated. By this means, the four pixel portions 11a to 11d can be regarded as one pixel, so that sensitivity of the cell becomes high.

On the other hand, when the gate pulse V1 is inputted at different timings to the four first transfer gate portions 13a to 13d and the gate pulse V2 is inputted at different timings to the four second transfer gate portions 15a to 15d, the charges of the pixel portions 11a to 11d are transferred at different timings to the charge detection portion 16 and accumulated. By this means, the four pixel portions 11a to 11d can be regarded as different pixel portions, so that the resolution of the cell increases.

That is, this solid-state imaging device can switch the sensitivity and the resolution of cells by controlling timings to apply the gate pulse V1 and the gate pulse V2.

Further, the charge detection portion 16 is connected with a transistor 93 through an amplifier 92. This transistor 93 is a selection transistor which selects one cell from a plurality of cells aligned in the solid-state imaging device 10. A gate of the selection transistor 93 is connected to this shift register 91, and the gate of this selection transistor 93 receives an input of a selection pulse SL outputted from the shift register 91 at a desired timing.

Further, the charge detection portion 16 is connected with a reset gate portion 94 and a drain 95 to which a constant voltage VD is applied in this order. The reset gate portion 94 is a gate which transfers an unnecessary charge accumulated in the charge detection portion 16 to the drain 95, and resets the charge detection portion 16. The reset gate portion 94 is connected to the shift register 91, and this reset gate portion 94 receives a reset pulse RS outputted from the shift register 91 at a desired timing.

When the charge is accumulated in the charge detection portion 16 in this solid-state imaging device, a signal voltage detected by the charge detection portion 16 is inputted to the selection transistor 93. Meanwhile, when the selection pulse SL is inputted from the shift register 91 to the gate of the selection transistor 93, the signal voltage to be inputted to the selection transistor 93 is inputted to the amplifier 96 through the selection transistor 93, and power is amplified and outputted.

On the other hand, an unnecessary charge which is accumulated in the charge detection portion 16 after the signal voltage is detected in the charge detection portion 16 is transferred to the drain 95 when the reset pulse RS is inputted from the shift register 91 to the reset gate portion 94 and the reset gate portion 94 is turned on. By this means, the charge detection portion 16 is reset.

Each solid-state imaging device 10 provided in the line sensor 80 illustrated in FIG. 15 generates a signal voltage by causing each cell provided in this device to operate as described above with reference to FIG. 16. The generated signal voltage is outputted to the circuit substrate 81, and an image is formed in an image processing circuit which is provided on the circuit substrate 81. The line sensor 80 forms an image in this way.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Figure 17:
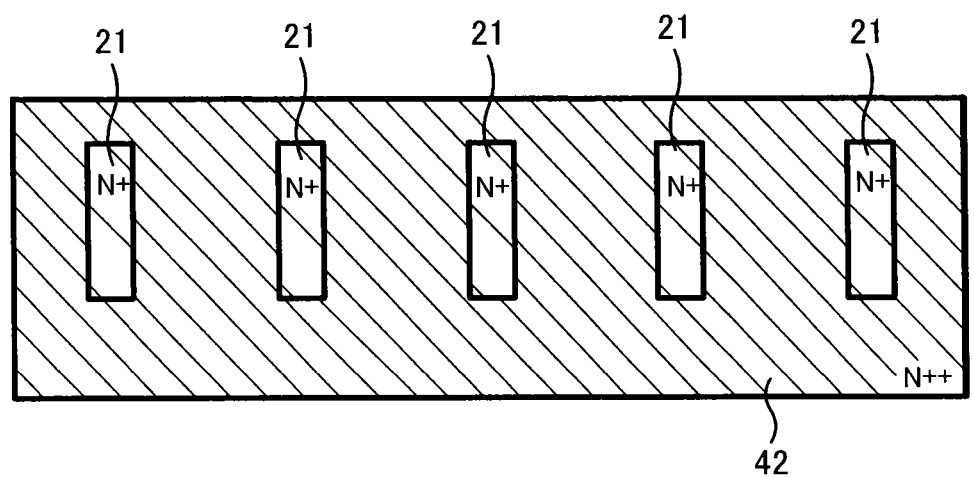
FIG. 17 is a plan view illustrating a modified example of a second charge accumulation layer provided in second and third charge accumulation portions.

For example, Although the second charge accumulation layer 22 of the second and third charge accumulation portions 12b and 12c has a ring shape which includes an opening portion in the center portion of this layer 22 in the solid-state imaging device 10 according to the first embodiment, the shape of the second charge accumulation layer is not limited to this shape. FIG. 17 illustrates a modified example of a second charge accumulation layer provided in the second and third charge accumulation portions 12b and 12c. As illustrated in FIG. 17, the second charge accumulation layer 42 may have a shape formed by connecting a plurality of ring shapes in parallel, that is, may be provided with a plurality of opening portions. For example, the second charge accumulation layer 42 is effective when the second and third charge accumulation portions 12b and 12c are long in an X direction.

In addition, although not illustrated, the second light receiving layers 33 and 67 provided in the pixel portions 31b and 61 may also have a shape formed by connecting a plurality of ring shapes in parallel, that is, a shape provided with a plurality of opening portions. This second light receiving layer is effective when the pixel portions 31b and 61 are long in the X direction.

Further, although the solid-state imaging device according to each of the above embodiment is provided on the P-type well layers 18 and 65 provided on the N-type semiconductor substrates 17 and 64, the solid-state imaging device does not necessarily need to be provided on the well layers 18 and 65 and may be provided on a P-type semiconductor substrate.

What is claimed is:

1. A solid-state imaging device comprising:
a pixel portion having a first light receiving layer which is provided in a planar shape on a surface of a semiconductor substrate and which produces a charge according to an amount of received light of incident light;
a charge accumulation portion having a first charge accumulation layer which is provided in a planar shape on the surface of the semiconductor substrate and which accumulates the charge produced in the pixel portion;
a first transfer gate portion reading the charge from the pixel portion and transferring the charge to the charge accumulation portion;
a charge detection portion to which the charge accumulated in the charge accumulation portion is transferred and which causes a voltage drop corresponding to an amount of the transferred charge to occur; and
a second transfer gate portion reading the charge accumulated in the charge accumulation portion and transferring the charge to the charge detection portion,
wherein an impurity layer of a ring shape which has an opening portion is provided on a surface of at least one of the first light receiving layer of the pixel portion and the first charge accumulation layer of the charge accumulation portion.

2. The solid-state imaging device according to claim 1, wherein the impurity layer of the ring shape is a second charge accumulation layer, and the second charge accumulation layer is provided on a surface of the first charge accumulation layer so as to be in contact with the second gate transfer portion.

3. The solid-state imaging device according to claim 1, wherein the impurity layer of the ring shape is a second light receiving layer, and
the second light receiving layer is provided on a surface of the first light receiving layer so as to be in contact with the first transfer gate portion.

4. The solid-state imaging device according to claim 1, wherein the impurity layer of the ring shape is a second light receiving layer and a second charge accumulation layer,
the second light receiving layer is provided on a surface of the first light receiving layer so as to be in contact with the first transfer gate portion, and
the second charge accumulation layer is provided on a surface of the first charge accumulation layer so as to be in contact with the second transfer gate portion.

5. The solid-state imaging device according to claim 1, further comprising between the second transfer gate portion and the charge detection portion an offset gate portion to which a predetermined constant voltage is applied,
wherein the charge accumulation portion is connected to the offset gate portion through the second transfer gate portion.

6. A solid-state imaging device comprising:
a plurality of pixel portions arranged in a line form, each of the plurality of pixel portions has a first light receiving layer which is provided on a surface of a semiconductor substrate and which produces a charge according to an amount of received light of incident light;
a plurality of charge accumulation portions arranged in a line form in parallel to an alignment direction of the plurality of pixel portions, each of the plurality of charge accumulation portions has a first charge accumulation layer which is provided on the surface of the semiconductor substrate and which accumulates the charge produced in the pixel portion;
a plurality of first transfer gate portions reading the charge from the plurality of pixel portions and transferring the charge to the plurality of charge accumulation portions;
a charge detection portion to which the charge accumulated in the plurality of charge accumulation portions is transferred and which causes a voltage drop corresponding to an amount of the transferred charge;
a plurality of second transfer gate portions reading the charge accumulated in the plurality of charge accumulation portions and transferring the charge to the charge detection portion; and
an offset gate portion having a shape which has long sides extending in a longitudinal direction which is the arrangement direction of the plurality of pixel portions and short sides extending in a direction substantially perpendicular to the longitudinal direction, the offset gate portion being provided between the plurality of second transfer gate portions and the charge detection portion so that the long sides and the short sides are adjacent to the plurality of second transfer gate portions, and being applied with a predetermined constant voltage,
wherein an impurity layer of a ring shape which has an opening portion is provided on a surface of at least one of the plurality of first light receiving layers of the plurality of the pixel portions and the plurality of first charge accumulation layers of the plurality of charge accumulation portions.

7. The solid-state imaging device according to claim 6,
wherein the impurity layer of the ring shape is a second charge accumulation layer, and
the second charge accumulation layer is provided on a surface of the first charge accumulation layer of the charge accumulation portion connected to the long side of the offset gate portion through the second transfer gate portion so as to be in contact with the second transfer gate portion.

8. The solid-state imaging device according to claim 7, wherein a second charge accumulation layer of a planar shape is provided on a surface of the first charge accumulation layer of the charge accumulation portion connected to the short side of the offset gate portion through the second transfer gate portion so as to be in contact with the second transfer gate portion.

9. The solid-state imaging device according to claim 8, wherein the second charge accumulation layer of the planar shape has a width which widens in a transfer direction of the charge.

10. The solid-state imaging device according to claim 6,
wherein the impurity layer of the ring shape is a second light receiving layer, and
the second light receiving layer is provided on a surface of the first light receiving layer of the pixel portion so as to be in contact with the first transfer gate.

11. The solid-state imaging device according to claim 6,
wherein the impurity layer of the ring shape is a second light receiving layer and a second charge accumulation layer,
the second light receiving layer is provided on a surface of the first light receiving layer so as to be in contact with the first transfer gate portion, and
the second charge accumulation layer is provided on a surface of the first charge accumulation layer of the charge accumulation portion connected to the long side of the offset gate portion through the second transfer gate portion so as to be in contact with the second transfer gate portion.

12. The solid-state imaging device according to claim 11, wherein a second charge accumulation layer of a planar shape is provided on the surface of the first charge accumulation layer of the charge accumulation portion connected to the short side of the offset gate portion through the second transfer gate portion so as to be in contact with the second transfer gate portion.

13. The solid-state imaging device according to claim 12, wherein the second charge accumulation layer of the planar shape has a width which widens in a transfer direction of the charge.

14. The solid-state imaging device according to claim 6, wherein the plurality of pixel portions have a shape of which the longitudinal direction is the alignment direction of the plurality of pixel portions.

15. A solid-state imaging device comprising:
a pixel portion has a first light receiving layer which is provided on a surface of a semiconductor substrate and which produces a charge according to an amount of received light of incident light;
a charge detection portion to which the charge accumulated in the pixel portion is transferred and which causes a voltage drop corresponding to an amount of the transferred charge; and
a transfer gate portion reading the charge accumulated in the pixel portion and transferring the charge to the charge detection portion,
wherein the pixel portion has a second light receiving layer of a ring shape which has an opening portion, the second light receiving layer provided on a surface of the first light reception surface so as to be in contact with the transfer gate portion.

16. A line sensor comprising:
a circuit substrate;
a plurality of solid-state imaging devices linearly arranged on a surface of the circuit substrate;
a light guide body arranged above the surface of the circuit substrate and emitting light to a subject; and
a lens array arranged above the surface of the circuit substrate and condensing the light reflected from the subject on the plurality of solid-state imaging devices, wherein:
each of the plurality of solid-state imaging devices comprises:
a pixel portion having a first light receiving layer which is provided on a surface of a semiconductor substrate and which produces a charge according to an amount of received light of incident light;
a charge accumulation portion having a first charge accumulation layer which is provided on the surface of the semiconductor substrate and which accumulates the charge produced in the pixel portion;
a first transfer gate portion reading the charge from the pixel portion and transferring the charge to the charge accumulation portion;
a charge detection portion to which the charge accumulated in the charge accumulation portion is transferred and which causes a voltage drop corresponding to an amount of the transferred charge; and
a second transfer gate portion reading the charge accumulated in the charge accumulation portion and transferring the charge to the charge detection portion,
wherein an impurity layer of a ring shape which has an opening portion is provided on a surface of at least one of the first light receiving layer of the pixel portion and the first charge accumulation layer of the charge accumulation portion.

17. The line sensor according to claim 16,
wherein the impurity layer of the ring shape of the solid-state imaging device is a second charge accumulation layer, and
the second charge accumulation layer is provided on a surface of the first charge accumulation layer so as to be in contact with the second gate transfer portion.

18. The line sensor according to claim 16,
wherein the impurity layer of the ring shape of the solid-state imaging device is a second light receiving layer, and
the second light receiving layer is provided on a surface of the first light receiving layer so as to be in contact with the first transfer gate portion.

19. The line sensor according to claim 16,
wherein the impurity layer of the ring shape is a second light receiving layer and a second charge accumulation layer,
the second light receiving layer is provided on a surface of the first light receiving layer so as to be in contact with the first transfer gate portion, and
the second charge accumulation layer is provided on a surface of the first charge accumulation layer so as to be in contact with the second transfer gate portion.

20. The line sensor according to claim 16,
wherein the solid-state imaging device further comprises between the second transfer gate portion and the charge detection portion an offset gate portion to which a predetermined constant voltage is applied, and
the charge accumulation portion is connected to the offset gate portion through the second transfer gate portion.

* * * * *